US012713906B2

(12) United States Patent
Wang et al.

(10) Patent No.: US 12,713,906 B2
(45) Date of Patent: Aug. 18, 2026

(54) MULTILAYER CAPACITORS WITH INTERDIGITATED FINGERS

(71) Applicant: Skyworks Solutions, Inc., Irvine, CA (US)

(72) Inventors: Hailing Wang, Acton, MA (US); Guillaume Alexandre Blin, Carlisle, MA (US); David Scott Whitefield, Andover, MA (US); Michael Joseph McPartlin, North Andover, MA (US); Lui Ray Lam, Lexington, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 321 days.

(21) Appl. No.: 18/457,271

(22) Filed: Aug. 28, 2023

(65) Prior Publication Data

US 2024/0079314 A1 Mar. 7, 2024

Related U.S. Application Data

(60) Provisional application No. 63/402,019, filed on Aug. 29, 2022, provisional application No. 63/402,016, filed on Aug. 29, 2022.

(51) Int. Cl.

| | |
|---|---|
| ***H10W 20/40*** | (2026.01) |
| ***H01G 4/012*** | (2006.01) |
| ***H01G 4/10*** | (2006.01) |
| ***H01G 4/12*** | (2006.01) |
| ***H01G 4/228*** | (2006.01) |
| ***H01G 4/30*** | (2006.01) |
| ***H01G 4/38*** | (2006.01) |
| ***H10D 1/68*** | (2025.01) |

(52) U.S. Cl.
CPC ............ *H10W 20/496* (2026.01); *H01G 4/30* (2013.01)

(58) Field of Classification Search
CPC ...... H01L 23/5223; H01G 4/30; H01G 4/012; H01G 4/10; H01G 4/1272; H01G 4/228; H01G 4/385; H10D 1/692; H10D 1/714; H10D 1/716; H10W 20/496; H10W 20/42
See application file for complete search history.

(56) References Cited

U.S. PATENT DOCUMENTS

| | | | | |
|---|---|---|---|---|
| 8,963,286 B2 * | 2/2015 | Lin | H10W 20/496 257/532 |
| 2014/0273394 A1 * | 9/2014 | Roehner | H01L 23/5223 438/396 |
| 2020/0020686 A1 * | 1/2020 | Bao | H10D 84/212 |

* cited by examiner

*Primary Examiner* — Sonya McCall-Shepard
(74) *Attorney, Agent, or Firm* — VIA LLP

(57) ABSTRACT

A circuit can include a capacitor that has a semiconductor layer, a dielectric layer, and a conductive layer. The circuit can include an insulating layer and a metal or conductive layer. The metal layer can have a first portion that has a first plurality of fingers, and a second portion that has a second plurality of fingers, which can be interdigitated with the first plurality of fingers. The circuit can include one or more first electrical connections that electrically couple the first portion of the metal layer to the semiconductor layer of the capacitor. The circuit can include one or more second electrical connections that electrically couple the second portion of the metal layer to the conductive layer of the capacitor. A capacitance provided by the interdigitated first and second pluralities of fingers can be at least about 3% of a capacitance provided by the capacitor.

30 Claims, 11 Drawing Sheets

100
114a
116a
140a
108
102
D
D
112
116b
114b
138a
116a
138b
140b 100
122
120
104
118
114a
114b
116b
C
106
136c
M4
130a
102
MCL1
128
108
136b
M4
130b
110
134
126
112
MCL2
113
136a
M4
V3
M3
M2
M1
136
133
132
130
129
125
124
114

102
102a
102b
116b
138b
138a
108
164
112
140a
114b
116a
140b
114
114a
168
114c
140c
116c
140d
138c
108
166
116d
138d

MULTILAYER CAPACITORS WITH INTERDIGITATED FINGERS

CROSS REFERENCE TO RELATED APPLICATIONS

This application claims the benefit of priority U.S. Provisional Patent Application No. 63/402,019, filed Aug. 29, 2022 and titled "MULTILAYER CAPACITORS WITH INTERDIGITATED FINGERS," and U.S. Provisional Patent Application No. 63/402,016, filed Aug. 29, 2022 and titled "CAPACITORS WITH IMPROVED CAPACITANCE DENSITY," the contents of each of which are hereby incorporated by reference in their entirety.

BACKGROUND

Technical Field

Embodiments of this disclosure relate to capacitors, and more particularly to capacitors with high capacitance density and/or high breakdown voltage.

Description of Related Technology

Capacitors can be incorporated into circuits and various other electrical components. Although various capacitor designs exist, there remains a need for improved capacitors, such as with improved capacitance density and/or improved breakdown voltage.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In accordance with some aspects of the disclosure, a circuit can include a first capacitor that can have a semiconductor layer, an insulating layer over the semiconductor layer, and a conductive layer over the insulating layer. The circuit can include a first insulating layer over the conductive layer of the first capacitor. The circuit can include a first metal layer over the first insulating layer. The first metal layer can have a first portion that has a first plurality of fingers, and a second portion that has a second plurality of fingers, which can be interdigitated with the first plurality of fingers. The circuit can include one or more first electrical connections that electrically couple the first portion of the first metal layer to the semiconductor layer of the first capacitor through the first insulating layer. The circuit can include one or more second electrical connections that electrically couple the second portion of the first metal layer to the conductive layer of the first capacitor through the first insulating layer.

The first capacitor can be a metal-oxide-semiconductor capacitor. The conductive layer of the first capacitor can overlap the semiconductor layer of the first capacitor, such as at an area that also overlaps a plurality of the first fingers and a plurality of the second fingers. The plurality of the first fingers can extend fully across the area where the conductive layer overlaps the semiconductor layer. The one or more first electrical connections can connect to a portion of the semiconductor layer of the first capacitor that extends laterally past an edge of the conductive layer of the first capacitor.

The circuit can include a second insulating layer over the first metal layer and a second metal layer over the second insulating layer. The second metal layer can have a first portion that has a third plurality of fingers and a second portion that has a fourth plurality of fingers, which can be interdigitated with the third plurality of fingers. One or more third electrical connections can electrically couple the first portion of the second metal layer to the first portion of the first metal layer. One or more fourth electrical connections can electrically couple the second portion of the second metal layer to the second portion of the first metal layer. The third plurality of fingers can extend along a direction that is substantially parallel to a direction that the first plurality of fingers extend along. The third plurality of fingers can extend along a direction that is substantially perpendicular to a direction that the first plurality of fingers extend along. In some embodiments, the circuit can include a third insulating layer over the second metal layer and a third metal layer over the third insulating layer. The third metal layer can have a first portion that has a fifth plurality of fingers and a second portion that has a sixth plurality of fingers, which can be interdigitated with the fifth plurality of fingers. One or more fifth electrical connections can electrically couple the first portion of the third metal layer to the first portion of the second metal layer. One or more sixth electrical connections can electrically couple the second portion of the third metal layer to the second portion of the second metal layer.

The circuit can include a second capacitor that includes an insulating layer between a first conductive layer and a second conductive layer. A footprint of the second capacitor can at least partially overlap a footprint of the first capacitor. The first conductive layer of the second capacitor can be electrically coupled to the semiconductor layer of the first capacitor through the first portion of the first metal layer. The second conductive layer of the second capacitor can be electrically coupled to the conductive layer of the first capacitor through the second portion of the first metal layer. A second capacitor can have a semiconductor layer, an insulating layer, and a conductive layer. The first insulating layer can extend over the conductive layer of the second capacitor. The second portion of the first metal layer can have a third plurality of fingers. The first metal layer can have a third portion that has a fourth plurality of fingers, which can be interdigitated with the third plurality of fingers. One or more third electrical connections can electrically couple the second portion of the first metal layer to the semiconductor layer of the second capacitor, such as through the first insulating layer. One or more fourth electrical connections can electrically couple the third portion of the first metal layer to the conductive layer of the second capacitor, such as through the first insulating layer.

In some embodiments, the first portion of the first metal layer can be electrically coupled to a first external electrical contact. The second portion of the first metal layer can be electrically coupled to a second external electrical contact. A capacitance provided by the interdigitated first and second pluralities of fingers can be at least about 3% of a capacitance provided by the first capacitor. A capacitance provided by the interdigitated first and second pluralities of fingers can be at least about 5% of a capacitance provided by the first capacitor. A capacitance provided by the interdigitated first and second pluralities of fingers can be at least about 10% of a capacitance provided by the first capacitor.

In accordance with some aspects of the disclosure, a method of making a circuit can include forming a semiconductor layer over a substrate, forming a dielectric layer over the semiconductor layer, forming a conductive layer over the dielectric layer to provide a capacitor, forming an insulating layer over the conductive layer, and forming a first metal layer over the insulating layer. The first metal layer can have a first portion and a second portion that is insulated from the first portion. The first portion can be electrically coupled to the semiconductor layer and can have a first plurality of fingers. The second portion can be electrically coupled to the conductive layer and can have a second plurality of fingers, which can be interdigitated with the first plurality of fingers.

A footprint of the interdigitated first and second plurality of fingers can overlap with a footprint of the capacitor. The method can include forming a second insulating layer over the first metal layer and forming a second metal layer over the second insulating layer. The second metal layer can have a first portion and a second portion that is insulated from the first portion. The first portion of the second metal layer can be electrically coupled to the first portion of the first metal layer and can have a third plurality of fingers. The second portion of the second metal layer can be electrically coupled to the second portion of the first metal layer and can have a fourth plurality of fingers, which can be interdigitated with the third plurality of fingers. The third plurality of fingers can extend along a direction that is substantially parallel to a direction that the first plurality of fingers extend along. The third plurality of fingers can extend along a direction that is substantially perpendicular to a direction that the first plurality of fingers extend along. The method can include forming a third insulating layer over the second metal layer and forming a third metal layer over the third insulating layer. The third metal layer can have a first portion and a second portion that is insulated from the first portion. The first portion of the third metal layer can have electrically coupled to the first portion of the second metal layer and can have a fifth plurality of fingers. The second portion of the third metal layer can be electrically coupled to the second portion of the second metal layer and can have a sixth plurality of fingers, which can be interdigitated with the fifth plurality of fingers.

The method can include forming a second capacitor that includes an insulating layer between a first conductive layer and a second conductive layer. A footprint of the second capacitor can at least partially overlap a footprint of the first capacitor. The method can include electrically coupling the first conductive layer of the second capacitor to the semiconductor layer of the capacitor, such as through the first portion of the first metal layer. The method can include electrically coupling the second conductive layer of the second capacitor to the conductive layer of the capacitor, such as through the second portion of the first metal layer.

In accordance with some aspects of the disclosure, a circuit can include a multilayer structure with a plurality of conductive layers and a plurality of insulating layers, and a capacitor embedded inside the multilayer structure. The capacitor can provide a first capacitance. The capacitor can have a cathode and an anode. The circuit can have a first conductive pathway through the multilayer structure that is electrically coupled to the cathode of the capacitor. The circuit can have a second conductive pathway through the multilayer structure that is electrically coupled to the anode of the capacitor and that is insulated from the first conductive pathway. Portions of the second conductive pathway can be disposed relative to portions of the first conductive pathway so that a second capacitance provided between the portions of the first conductive pathway and the portions of the second conductive pathway is at least about 3% of the first capacitance. The second capacitance can be at least about 5% of the first capacitance. The second capacitance can be at least about 10% of the first capacitance. The second capacitance can be at least about 15% of the first capacitance. The second capacitance can be at least about 20% of the first capacitance.

The first conductive pathway can include a first plurality of fingers. The second conductive pathway can include a second plurality of fingers, which can be interdigitated with the first plurality of fingers. A footprint of the interdigitated first and second pluralities of fingers can overlap a footprint of the capacitor. The first and second conductive pathways can provide two layers of interdigitated fingers. A direction of the fingers of a first of the two layers can be substantially parallel to a direction of the fingers of a second of the two layers. A direction of the fingers of a first of the two layers can be substantially perpendicular to a direction of the fingers of a second of the two layers. The first and second conductive pathways can provide three layers of interdigitated fingers. The capacitor can be a metal-oxide-semiconductor capacitor. The circuit can include an additional capacitor embedded inside the multilayer structure in a side-by-side configuration with the capacitor. The additional capacitor can have a cathode and an anode. The anode of the capacitor can be electrically coupled to the cathode of the additional capacitor.

In accordance with some aspects of the disclosure, a circuit can include a semiconductor layer that can have a first portion and a second portion that is insulated from the first portion, a dielectric layer over the semiconductor layer, and a conductive layer over the dielectric layer. The conductive layer can have a first portion and a second portion that is insulated from the first portion. The circuit can have an insulating layer over the conductive layer. The circuit can have a metal layer over the insulating layer. The metal layer can have a first portion, a second portion that is insulated from the first portion, and a third portion that is insulated from the first portion and the second portion. The first portion of the metal layer can be electrically coupled to the first portion of the semiconductor layer. The second portion of the metal layer can be electrically coupled to the first portion of the conductive layer and to the second portion of the semiconductor layer. The third portion of the metal layer can be coupled to the second portion of the conductive layer.

The first portion of the metal layer can have a first plurality of fingers. The second portion of the metal layer can have a second plurality of fingers, which can be interdigitated with the first plurality of fingers. The second portion of the metal layer can have a third plurality of fingers. The third portion of the metal layer can have a fourth plurality of fingers, which can be interdigitated with the third plurality of fingers.

In accordance with some aspects of the disclosure, a capacitor can include a cathode layer, an anode layer, an insulating layer between the cathode layer and the anode layer, a first plurality of fingers that can be electrically coupled to the cathode layer, and a second plurality of fingers that can be electrically coupled to the anode layer. The second plurality of fingers can be interdigitated with the first plurality of fingers, such as to increase the capacitance of the capacitor.

The cathode layer can be a semiconductor material. The insulating layer can be an oxide material. The anode layer can be a metal material. The cathode layer can be substantially planar. The anode layer can be substantially planar. A first line normal to the cathode and anode layers can intersect the cathode layer, the anode layer, and one of the first plurality of fingers. A second line normal to the cathode and anode layers can intersect the cathode layer, the anode layer, and one of the second plurality of fingers.

The capacitor can include a third plurality of fingers that are electrically coupled to the cathode layer and a fourth plurality of fingers that are electrically coupled to the anode layer. The fourth plurality of fingers can be interdigitated with the third plurality of fingers, such as to increase the capacitance of the capacitor. The cathode layer can be substantially planar. The anode layer can be substantially planar. A first line normal to the cathode and anode layers can intersect the cathode layer, the anode layer, one of the first plurality of fingers, and one of the third plurality of fingers. A second line normal to the cathode and anode layers can intersect the cathode layer, the anode layer, one of the second plurality of fingers, and one of the fourth plurality of fingers. The third plurality of fingers can extend along a direction that is substantially parallel to a direction that the first plurality of fingers extend along. The third plurality of fingers can extend along a direction that is substantially perpendicular to a direction that the first plurality of fingers extend along. The capacitor can include a fifth plurality of fingers that can be electrically coupled to the cathode layer, and a sixth plurality of fingers that can be electrically coupled to the anode layer. The sixth plurality of fingers can be interdigitated with the fifth plurality of fingers, such as to increase the capacitance of the capacitor.

The capacitor can include a second capacitor that can include an insulating layer between a cathode layer and an anode layer. The second capacitor can be positioned so that a line intersects the cathode layer, insulating layer, and anode layer of the first capacitor and also intersects the cathode layer, insulating layer, and anode layer of the second capacitor. The cathode layer of the second capacitor can be electrically coupled to the cathode layer of the first capacitor, such as through the first plurality of fingers. The anode layer of the second capacitor can be electrically coupled to the anode layer of the first capacitor, such as through the second plurality of fingers.

The capacitor can include an additional cathode layer, an additional anode layer, an additional insulating layer between the additional cathode layer and the additional anode layer, a third plurality of fingers that can be electrically coupled to the additional cathode layer, and a fourth plurality of fingers that can be electrically coupled to the additional anode layer. The fourth plurality of fingers can be interdigitated with the third plurality of fingers. The capacitor can include an electrical interconnection that electrically couples the cathode of the capacitor to the additional anode.

A capacitance provided by the interdigitated first and second pluralities of fingers can be at least about 3%, about 5%, about 10% (or any other suitable values or ranges, as discussed herein) of a capacitance provided by the anode layer and cathode layer.

BRIEF DESCRIPTION OF THE DRAWINGS

Embodiments of this disclosure will now be described, by way of non-limiting example, with reference to the accompanying drawings.

DETAILED DESCRIPTION

Figure 2:
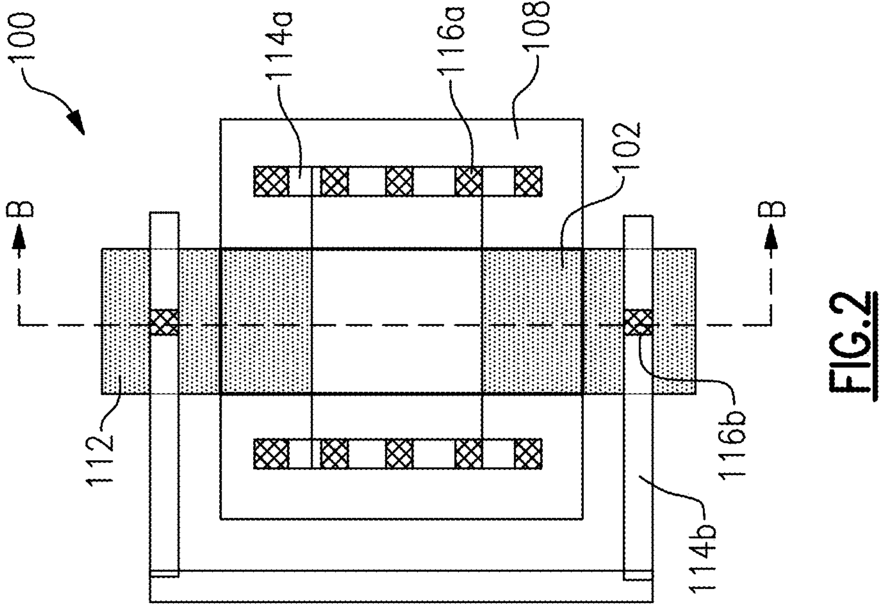
FIG. 2 is a cross-sectional plan view of an example embodiment of a circuit that includes a capacitor.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

In integrated circuits, such as analog control circuits for radio frequency (RF) devices or other RF circuits, much of the area can be occupied by capacitors. In some cases 75% to 90% of a circuit can be occupied by capacitors, although other configurations are possible. Some techniques and features that can be used to make transistors and other active components smaller do not apply well to passive components such as capacitors and inductors. Thus, further reduction in the area used by active components can have diminishing returns, since the passive components would still occupy most of the area of the circuit. Some embodiments disclosed herein can provide increased capacitance density, which can reduce the overall circuit or die size for various devices. In some cases a high-density metal-insulator-metal capacitor (MIMCAP) can be used, but that approach can use additional masks, which can result in increased cost, complexity, and failure rates. In some cases, a metal-oxide-semiconductor capacitor (MOSCAP) that has a thinner gate oxide can be used, but that approach can result in lower breakdown voltages. Various embodiments disclosed herein can provide increased capacitor density without adding additional masks or layers, and/or without reducing the breakdown voltage. Various embodiments disclosed herein can provide an increased breakdown voltage. Various embodiments disclosed herein can provide increased capacitor density.

Figure 1:
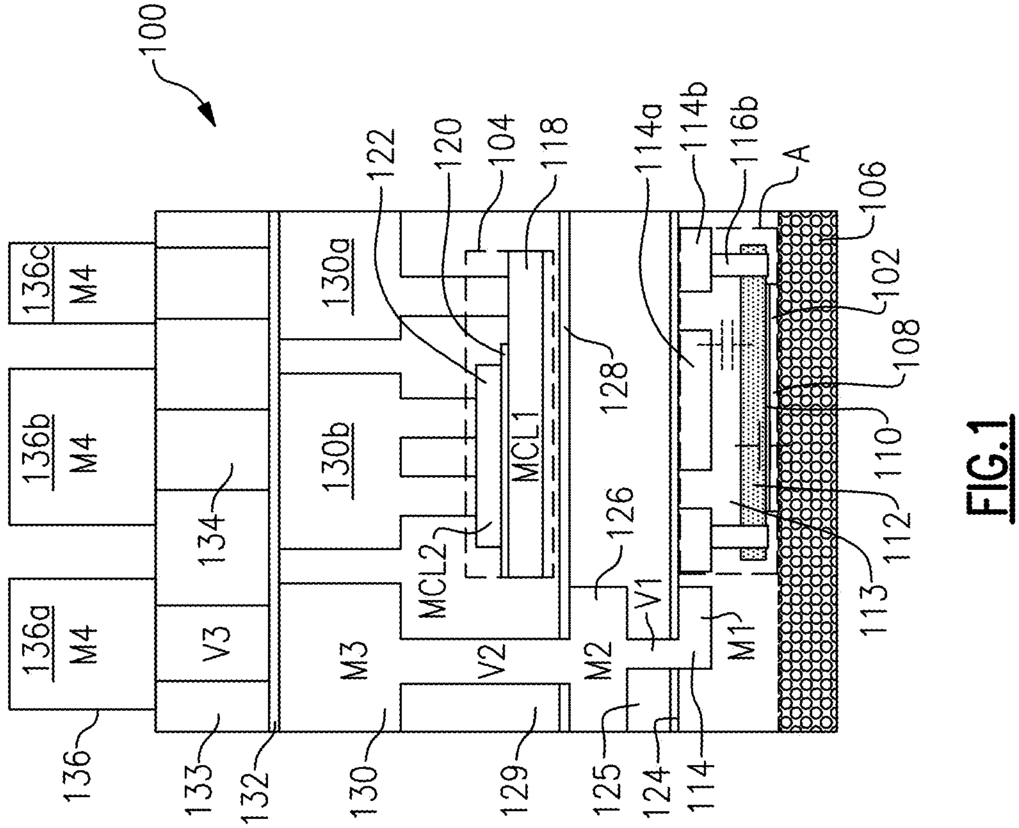
FIG. 1 is a cross-sectional side view of an example embodiment of a circuit that includes a capacitor.

FIG. 1 is a cross-sectional view of an example of a circuit 100 (e.g., an integrated circuit) that includes one or more capacitors. The circuit 100 can include a first capacitor 102, which can be a MOSCAP. The circuit 100 can include a second capacitor 104, which can be a MIMCAP. FIG. 2 shows a plan view of the portion A of the circuit, which includes the first capacitor 102. The cross-section of FIG. 1 is taken through line B-B of FIG. 2. The circuit can include a substrate 106. The substrate 106 can be a buried oxide material, although any suitable substrate material can be used. In some embodiments, the substrate 106 can be silicon dioxide (SiO2). The substrate 106 can be an insulating material.

A semiconductor layer 108 can be formed (e.g., deposited) over the substrate 106. The semiconductor layer 108 can be silicon (Si), although various other suitable semiconductor materials could be used. An insulating layer 110 can be formed (e.g., deposited) over the semiconductor layer 108. The insulating layer 110 can be SiO2, although various other insulating materials could be used. A conductive layer 112 can be formed (e.g., deposited) over the insulating layer 110. The conductive layer 112 can be a metal (e.g., aluminum) or any other suitable conductive material. The semiconductor layer 108, the insulating layer 110, and the conductive layer 112 can form a MOSCAP, which can be the first capacitor 102. A portion of the conductive layer 112 can extend laterally beyond the semiconductor layer 108 in a first dimension (e.g., horizontally in FIG. 1 and vertically in FIG. 2). A portion of the semiconductor layer 108 can extend beyond the conductive layer 112, such as in a second dimension (e.g., horizontally in FIG. 2). A portion of the semiconductor layer 108 can be exposed or accessible (e.g., from above) without passing through the conductive layer 112. The area where the conductive layer 112 and the semiconductor layer 108 overlap can provide the capacitor 102. The capacitance between the conductive layer 112 and the semiconductor layer 108 is represented in FIG. 1 as the solid capacitor symbol. The semiconductor layer 108, the insulating layer 110, and/or the conductive layer 112 can be substantially planar. The conductive layer 112 can be the gate of a MOSCAP. The semiconductor layer 108 can be an active region of a MOSCAP. The insulating layer 110 can be a dielectric material. The semiconductor layer 108 can be a cathode of the capacitor 102, and the conductive layer 112 can be an anode of the capacitor 102, although any suitable design can be used.

An insulating material or layer 113 can be formed (e.g., deposited) over the conductive layer. The insulating material or layer 113, as well as other insulating layers or materials disclosed herein, can be SiO2, or any other suitable insulating material. A metal layer 114 (e.g., a first metal layer M1) can be formed (e.g., deposited) over the insulating material 113. The metal layer 114 can be patterned, and the insulating material 113 can be disposed between portions of the metal layer 114. The metal layer 114 can include a first portion 114*a* and a second portion 114*b*. The first portion 114*a* can be electrically coupled to the semiconductor layer 108, such as by an electrical connection 116*a* (e.g., a via through the insulating layer 113). The electrical connection 116*a* can extend generally vertically between a part of the first portion 114*a* of the metal layer 114 that is positioned over the portion of the semiconductor layer 108 that extends beyond the conductive layer 112. The second portion 114*b* can be electrically coupled to the conductive layer 112, such as by an electrical connection 116*b* (e.g., a via through the insulating layer 113). The electrical connection 116*b* can extend generally vertically between a part of the second portion 114*b* of the metal layer 114 that is positioned over the portion of the conductive layer 112 that extends beyond the semiconductor layer 108. In some implementations, there can be a small parasitic capacitance between the conductive layer 112 and the metal layer 114. The parasitic capacitance can be, for example, about 1% of the capacitance between the semiconductor layer 108 and the conductor layer 112. The parasitic capacitance is shown in FIG. 1 as the dashed capacitor symbol between the metal layer 114 and the conductive layer 112.

Although not shown in FIG. 2, the first portion 114*a* of the metal layer can be electrically coupled to one or more electrical interconnection lines, so that electricity can be delivered to, or received from, the semiconductor layer 108. Also, although not shown in FIG. 2, the second portion 114*b* of the metal layer can be electrically coupled to one or more electrical interconnection lines, so that electricity can be delivered to, or received from, the conductive layer 112. Accordingly, the capacitor 102 can be embedded within the circuit 100, and the electrical interconnection lines can provide electrical access to the capacitor 102 from outside the circuit. For example, with reference to FIG. 1, a portion of the metal layer 114 (e.g., that is not shown in the plane of the cross-section of FIG. 1) can interconnect the portion of the metal layer 114 labeled M1 (on the left side of FIG. 1) to the second portion 114*b* of the metal layer, which is electrically coupled to the conductive layer 112 of the capacitor 102. The M1 portion of the metal layer 114 can be electrically connected (e.g., by a via V1) to the metal layer labeled M2, which can be electrically connected (e.g., by a via V2) to the metal layer labeled M3, which can be electrically connected (e.g., by a via V3) to the metal layer labeled M4, which can be exposed to the outside of the circuit 100 (e.g., as a contact pad or pin). Accordingly, electrical power or signals can be delivered to, or received from, the conductive layer 112 of the capacitor 102 using a first electrical contact of the M4 layer. A similar series of electrical interconnection lines can provide access for electrical power or signals to be delivered to, or received from, the semiconductor layer 108 of the capacitor 102 using a second electrical contact (not shown in FIG. 1) of the M4 layer.

The layers of conductive material (e.g., metal) separated by insulating material can be used to route electrical interconnection lines to various electrical components of the circuit 100. For example, the circuit 100 can include a second capacitor 104, which can be seen in FIG. 1. The second capacitor 104 can be a MIMCAP, although various types of capacitors could be used. The capacitor 104 can include a first conductive (e.g., metal) layer 118 (e.g. labeled MCL1), and insulating layer 120, and a second conductive (e.g., metal) layer 122 (e.g., labeled MCL2). The capacitor 104 can be supported by the substrate 106 (e.g., and any intermediate layers between the substrate 106 and the capacitor 104). The circuit 100 can include various other electrical components, such as additional capacitors, transistors, inductors, diodes, resistors, switches, amplifiers, etc., which can be embedded inside the layers of the circuit 100 in some implementations, and which can be interconnected to each other and/or to external electrical contacts by electrical interconnections lines (e.g., patterned metal layers and/or vias). The first conductive layer 118 can be a lower plate, and the second conductive layer 122 can be an upper plate (e.g., of a MIMCAP). The insulating layer 120 can be a dielectric material.

With continued reference to FIG. 1, the circuit can have an insulating layer 124 that is formed (e.g., deposited) over the metal layer 114. Additional insulating material 125 can be formed (e.g., deposited) over the insulating layer 124 in some cases, although in some cases one insulating layer can be used and either of the insulating layers 124 and 125 can be omitted, or the layers 124 and 125 can be combined. A metal layer 126 can be formed (e.g., deposited) over the insulating layer(s) 124 and/or 125. The metal layer 126 (e.g., layer M2) can be patterned, and insulating material 125 can be disposed between portions of the metal layer 126, such as to form electrical interconnection pathways, which can connect to one or more electrical components that are not shown in FIG. 1. Portions of the metal layer 126 can be electrically coupled to portions of the metal layer 114 using vias or other electrical connections. An insulating layer 128 can be formed (e.g., deposited) over the metal layer 126. Additional insulating material 129 can be formed (e.g., deposited) over the insulating layer 128 in some cases, although in some cases one insulating layer can be used and either of the insulating layers 128 and 129 can be omitted, or the layers 128 and 129 can be combined. The first conductive (e.g., metal) layer 118 of the capacitor 104 can be formed (e.g., deposited) over the insulating layer 128 and/or over the insulating material 129. The insulating layer 120 can be formed (e.g., deposited) over the first conductive layer 118. The second conductive (e.g., metal) layer 122 can be formed (e.g., deposited) over the insulating layer 120. Additional insulating material 129 can be formed (e.g., deposited) over the capacitor 104, such as over the second conductive layer 122.

A metal layer 130 (e.g., labeled M3 in FIG. 1) can be formed (e.g., deposited) over the insulating material 129. The metal layer 130 can be patterned, and insulating material 129 can be disposed between portions of the metal layer 130, such as to form electrical interconnection pathways. Vias or other electrical connections can electrically couple a first portion 130*a* of the metal layer 130 to the first conductive layer 118, and a second portion 130*b* of the metal layer 130 to the second conductive layer 122. Vias or other electrical connections can electrically couple portions of the metal layer 130 to portions of the metal layer 126. An insulating layer 132 can be formed (e.g., deposited) over the metal layer 130. Additional insulating material 133 can be formed (e.g., deposited) over the insulating layer 132 in some cases, although in some cases one insulating layer can be used and either of the insulating layers 132 and 133 can be omitted, or the layers 132 and 133 can be combined. Vias 134 (V3) or other electrical connections can electrically couple portions of the metal layer 136 to portions of the metal layer 130.

A metal layer or material 136 (e.g., labeled M4 in FIG. 1) can be formed (e.g., deposited) over the conductive layer 134 and/or over the insulating material 133. The metal layer 136 can be patterned or otherwise formed to have different portions, which can be electrically accessed separately. In some embodiments, the metal material 136 can include a first electrical contact 136*a*, which can be electrically coupled to the conductive layer 112 of the first capacitor 102, as discussed herein. The metal material 136 can include a second electrical contact 136*b*, which can be electrically coupled to the second conductor 122 of the second capacitor 104. The metal material 136 can include a third electrical contact 136*c*, which can be electrically coupled to the first conductor 118 of the second capacitor 104. The circuit 100 can include additional electrical contacts similar to the contacts 136*a*, 136*b*, and 136, for sending or receiving electrical power or signals to or from other components of the circuit 100. For example, an additional electrical contact (not shown in FIG. 1), and associated pathways through various other layers of the circuit 100 can provide an electrical connection to the semiconductor layer 108 of the first capacitor 102. The electrical contacts 136*a-c* can be a ball grid array, pins, wire-bond connections, or any other suitable type of electrical contact structure.

The conductive layers and materials discussed herein can be aluminum, or any other suitable conductive material. The insulating layers and materials can be SiO2, or any other suitable insulating material. The metal layers and materials discussed herein, such as metal layers 114, 126, 130, 134, and 136 can be substituted with a non-metal conductive material, in some implementations. Many variations are possible. For example, the circuit 100 can have additional metal/conductive and insulating layers to provide additional levels for routing electrical interconnections. In some cases, layers can be omitted so that the circuit 100 can have fewer levels of routing for the electrical interconnections. The circuit 100 of FIG. 1 has two capacitors 102 and 104, but any suitable number of capacitors (e.g., 1, 2, 3, 5, 7, 10, or more) can be used, depending on the application.

Figures 3, 4:
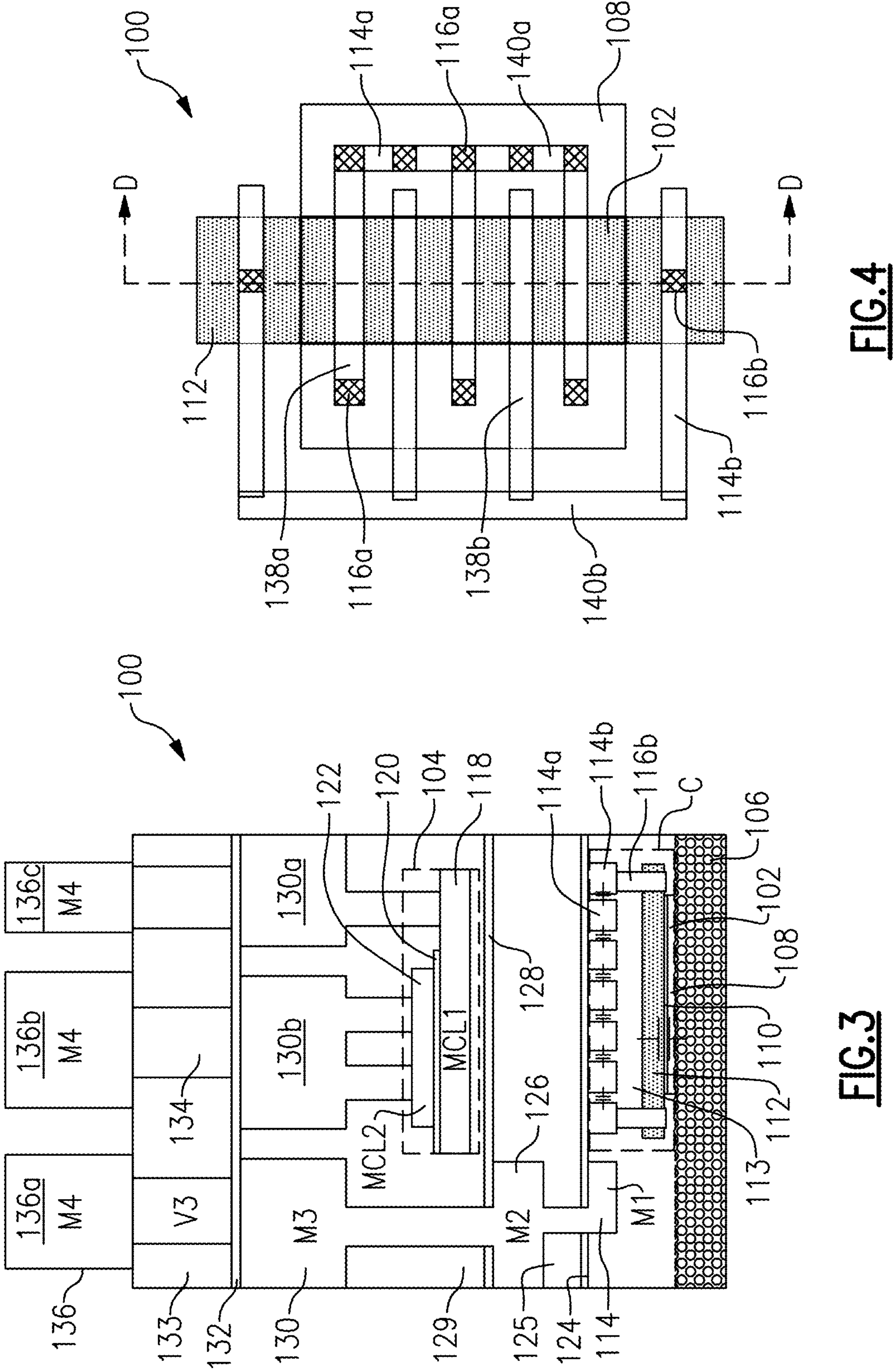
FIG. 3 is a cross-sectional side view of an example embodiment of a circuit that includes a capacitor.
FIG. 4 is a cross-sectional plan view of an example embodiment of a circuit that includes a capacitor.

FIG. 3 is a cross-sectional view of an example of a circuit 100, which can be similar to the circuit 100 of FIG. 1, except as discussed herein. FIG. 4 shows a plan view of the portion C of the circuit 100 of FIG. 3, which includes the first capacitor 102. The cross-section of FIG. 3 is taken through line D-D of FIG. 4. The metal layer 114 can have interdigitated fingers 138*a* and 138*b*, which can increase the capacitance of the capacitor 102. The first portion 114*a* of the metal layer 114 can have a first plurality of fingers 138*a*. The fingers 138*a* can extend generally parallel to each other, such as in a first direction. Each finger 138*a* can have a coupled end, which can be coupled to a bus bar 140*a* or other interconnection element, and a free end opposite the coupled end. The first fingers 138*a* can be spaced apart with gaps between the first fingers 138*a*. The second portion 114*b* of the metal layer 114 can have a second plurality of fingers 138*b*. The fingers 138*b* can extend generally parallel to each other, such as in a second direction, which can be opposite the first direction. Each of the second fingers 138*b* can have a coupled end, which can be coupled to a bus bar 140*b* or other interconnection element, and a free end opposite the coupled end. The second fingers 138*b* can be spaced apart with gaps between the second fingers 138*b*. The first fingers 138*a* and fit into the gaps between the second fingers 138*b*. The second fingers 138*b* can fit into the gaps between the first fingers 138*a*. The first fingers 138*a* and the second fingers 138*b* can be interdigitated, as shown for example in FIG. 4. In the example of FIG. 4, the circuit 100 has three first fingers 138*a* and four second fingers 138*b*, but each side can have any suitable number of fingers (e.g., 2, 3, 4, 5, 7, 10, 12, 16, 20, 25, or more, or any values or ranges between any of these values). A plurality of the first fingers 138*a* and/or a plurality of the second fingers 138*b* can extend all the way across the width (or other dimension) of the area of overlap between the semiconductor layer 108 and the conductive layer 112.

In some embodiments, the some or all of the first fingers 138*a* can be electrically coupled to the semiconductor layer 108, such as by vias 116*a* or other electrical connections. In the example of FIG. 4, the three fingers 138*a* each are connected to a via 116*a* (e.g., at the free end, although other locations could be used) that extends from the finger downward through insulating material 113 to the semiconductor layer 108. In some embodiments, the some or all of the second fingers 138*b* can be electrically coupled to the conductive layer 112, such as by vias 116*b* or other electrical connections. In the example of FIG. 4, the two outer fingers 138*b* are connected to vias 116*b* that extends from the finger downward through insulating material 113 to the conductive layer 112, while the two inner arms 138*b* are not directly coupled to a via 116*b*. However, the two inner fingers 138*b* are electrically coupled to the two outer fingers 138*b*, and through the vias 116*b* to the conductive layer 112. The fingers 138*a* and 138*b* can be separated by insulating material 113. Many variations are possible. The two inner fingers of the second fingers 138*b* can have vias similar to the vias 116*b* that couple the fingers 138*b* to the conductive layer 112 (e.g., to the top thereof). In some embodiments, as shown in FIG. 4, none of the vias 116*a*, 116*b* are positioned in the area where the conductive layer 112 overlaps the semiconductor layer 108. In some embodiments, the vias 116*a* at the free ends of the fingers 138*a* can be omitted. The first fingers 138*a* can still be electrically coupled to the semiconductor layer 108, such as by the vias 116*a* on the bus bar 140*a*.

Figure 5:
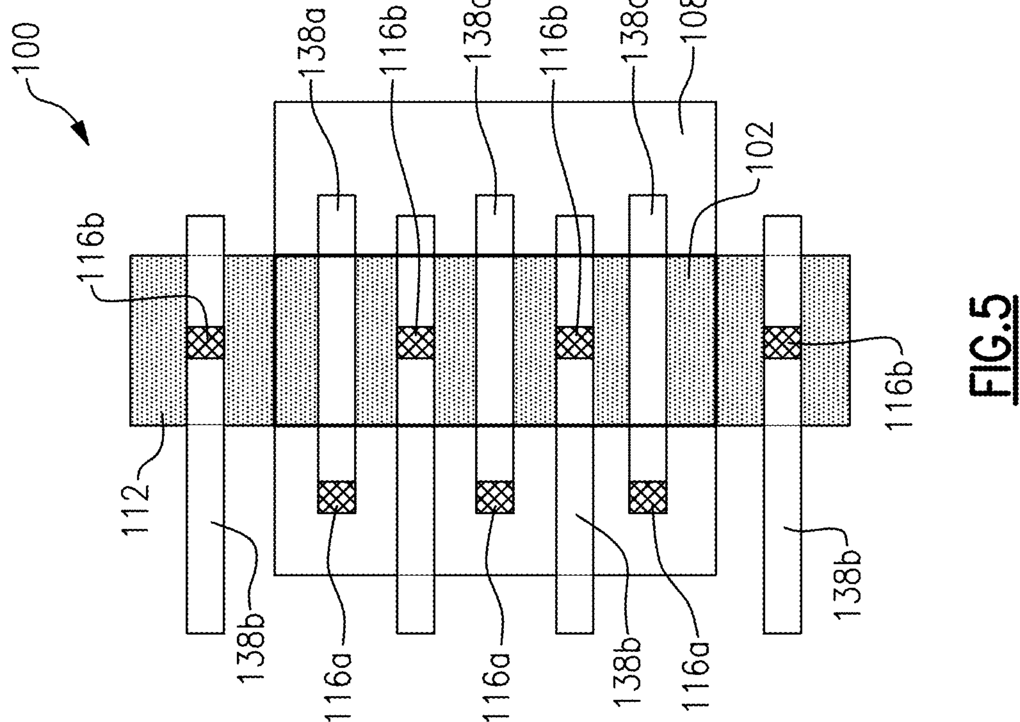
FIG. 5 is a cross-sectional plan view of an example embodiment of a circuit that includes a capacitor.

The first fingers 138*a* can be interconnected by the first metal layer 114, such as by the first bus bar 140*a*. The metal layer 114 can have other patterns that interconnect the first fingers 138*a*. The second fingers 138*b* can be interconnected by the first metal layer 114, such as by the second bus bar 140*b*. The metal layer 114 can have other patterns that interconnect the second fingers 138*b*. With reference to FIG. 5, in some embodiments, one or both of the bus bars 140*a*, 140*b* can be omitted. The first fingers 138*a* can each have one or more vias that electrically couple each of the first fingers 138*a* to the semiconductor layer 108. The second fingers 138*b* can each have one or more vias that electrically couple each of the second fingers 138*b* to the conductive layer 112. Thus, in some embodiments, the first fingers 138*a* are not interconnected through the metal layer 114, but the first fingers 138*a* are interconnected through the semiconductor layer 108 and the vias or other connections 116*a*. In this embodiment, the second fingers 138*b* are also not interconnected through the metal layer 114, but the second fingers 138*b* are interconnected through the conductive layer 112 and the vias or other connections 116*b*. In some embodiments, the fingers 138*a* and 138*b* are not used for routing signals or electrical power to the capacitor 102, and the capacitor 102 can receive electrical signals or power through other electrical pathways.

In some embodiments, the gaps between adjacent first fingers 138*a* and second fingers 138*b* and be substantially the same. In some embodiments, the size of the gaps can differ between different sets of adjacent fingers 138*a*, 138*b*. For example, in FIG. 4, the gaps between the outer second fingers 138*b* and the adjacent first ringers 138*a* can be larger than the gaps between the inner second fingers 138*b* and the adjacent first fingers 138*a*.

A first charge (e.g., a negative charge) can build up on the first fingers 138*a*, and a second charge (e.g., a positive charge) can build up on the second fingers 138*b*, that is opposite the first charge. The interdigitated fingers 138*a*, 138*b* can function like additional area of the semiconductor layer or plate 108 and conductive layer or plate 112 of the capacitor 102. Accordingly, the fingers 138*a*, 138*b* can increase the capacitance of the capacitor 102, such as without adding any additional layers, and without increasing the footprint of the circuit 100. FIG. 3 shows the capacitance between the semiconductor layer 108 and the conductive layer 112 as a capacitance symbol that bridges those layers. FIG. 3 shows the capacitance between the adjacent interdigitated fingers 138*a*, 138*b* as capacitance symbols that bridge the gaps between the fingers 138*a*, 138*b*.

Figure 6:
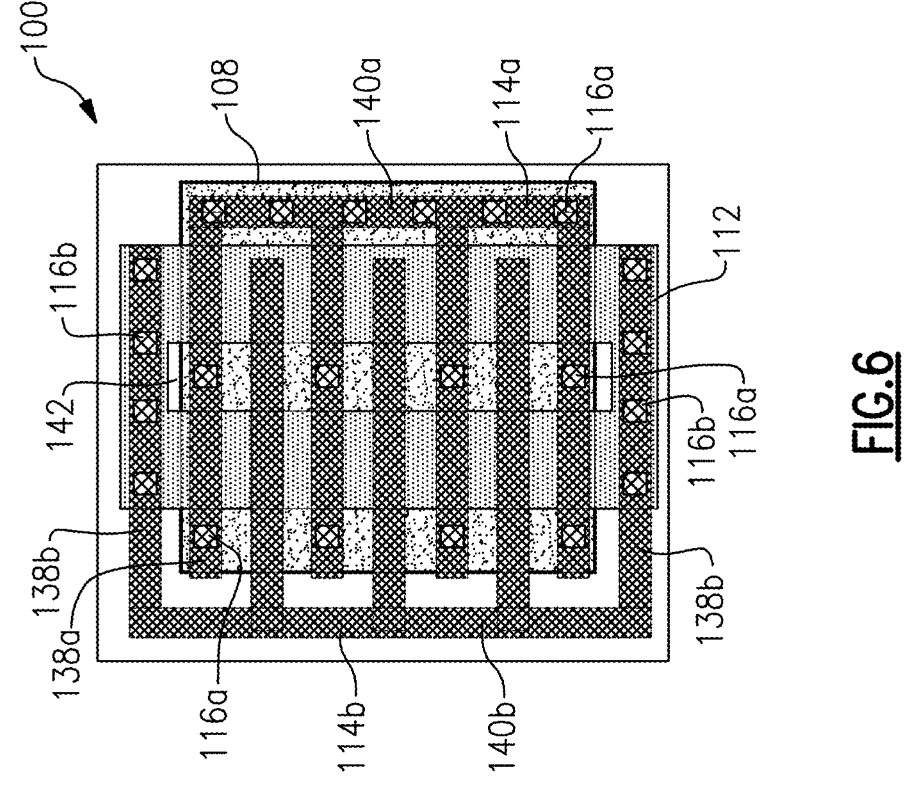
FIG. 6 is a cross-sectional plan view of an example embodiment of a circuit that includes a capacitor.

FIG. 6 is a cross-sectional view of another example embodiment of a circuit 100, which can be similar to the embodiment of FIG. 4. In FIG. 6, the components are shown semi-transparent to facilitate the illustration of underlying components. The circuit 100 of FIG. 6 can have four first fingers 138*a* and five second finger 138*b*. The circuit 100 can have a conductive layer 112 that has an opening 142 in the center thereof. Electrical connections (e.g., vias) 116*a* can connect the first fingers 138*a* to the semiconductor layer 108, and some of the vias 116*a* can extend through the opening 142 in the conductive layer 112. The outer second arms 138*b* can be coupled to the semiconductor layer 108 by a plurality of vias 116*b*. The inner second arms 138*b* do not have vias 116*b*, but they are electrically coupled to the semiconductor layer 108 by the outer second arms 138*b* and via the bus bar 140*b* structure. The first fingers 138*a* and/or the first bus bar 140*a* can form part of the cathode of the capacitor 102. The second fingers 138*b* and/or the second bus bar 140*b* can form part of the anode of the capacitor 102.

Figure 7:
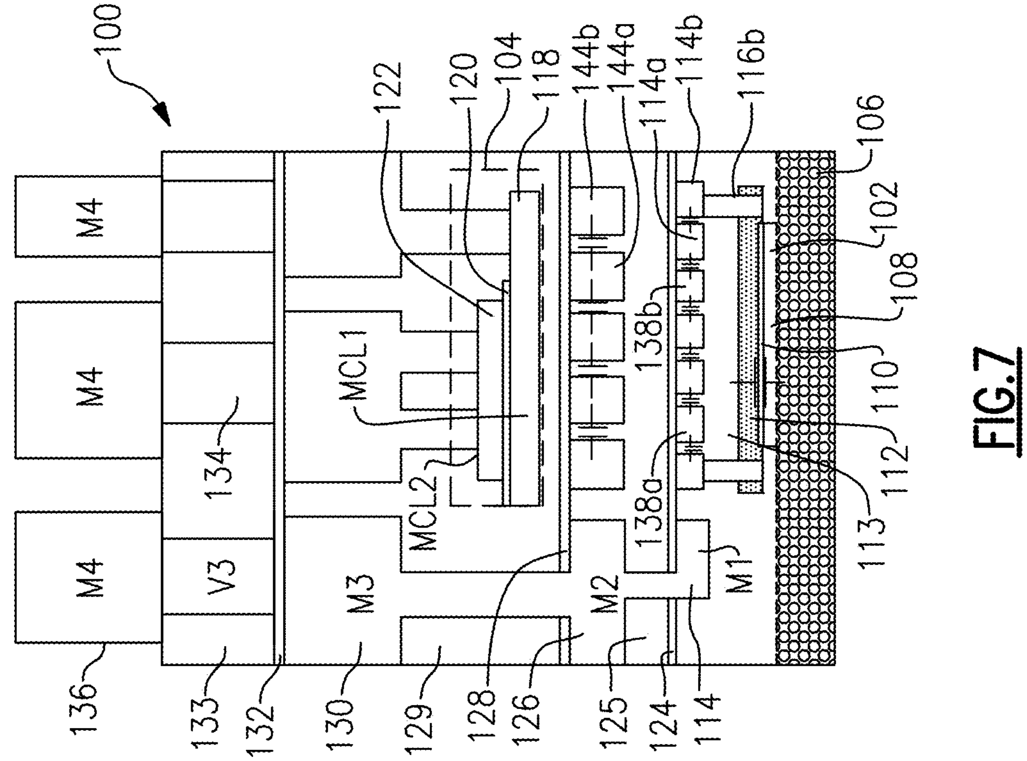
FIG. 7 is a cross-sectional side view of an example embodiment of a circuit that includes a capacitor.

FIG. 7 shows a cross-sectional view of another example embodiment of a circuit 100. In some embodiments, the circuit 100 can include one or more additional layers of conductive interdigitated fingers. The additional interdigitated fingers can be electrically coupled to portions of the metal layer 114, so as to produce additional capacitance for the capacitor 102. The metal layer 126 can include a first portion with first fingers 144*a* and a second portion with second fingers 144*b*. The first fingers 144*a* and the second fingers 144*b* can be interdigitated, similar to the fingers 138*a* and 138*b*. The first fingers 144*a* of metal layer 126 can be electrically coupled to the first fingers 138*a* of the metal layer 114 and/or to the semiconductor layer 108 of the capacitor 102. The second fingers 144*b* of metal layer 126 can be electrically coupled to the second fingers 138*b* of the metal layer 114 and/or to the conductive layer 112 of the capacitor 102. The first and second fingers 144*a* and 144*b* can provide additional capacitance to the capacitor 102.

Figure 8:
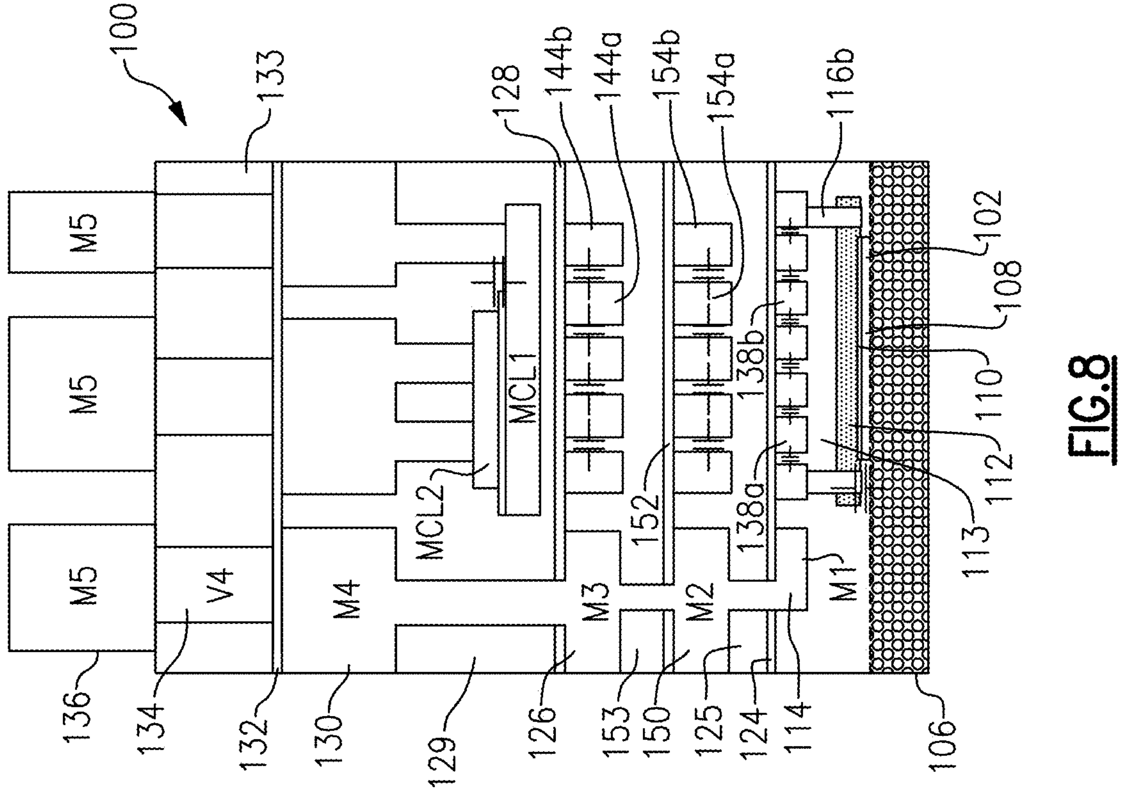
FIG. 8 is a cross-sectional side view of an example embodiment of a circuit that includes a capacitor.

FIG. 8 shows another embodiment in which an additional metal layer 150 (e.g., labeled M2) is included between the metal layers 114 and 126. One or more insulating layers 152 or insulating material 153 can be included, to insulate the metal layer 150 from the metal layer 126. The metal layer 150 can include a first portion with first fingers 154*a* and a second portion with second fingers 154*b*. The first fingers 154*a* and the second fingers 154*b* can be interdigitated, similar to the fingers 138*a* and 138*b*. The first fingers 154*a* of metal layer 150 can be electrically coupled to the first fingers 138*a* of the metal layer 114 and/or to the semiconductor layer 108 of the capacitor 102. The second fingers 154*b* of metal layer 150 can be electrically coupled to the second fingers 138*b* of the metal layer 114 and/or to the conductive layer 112 of the capacitor 102. The first and second fingers 154*a* and 154*b* can provide additional capacitance to the capacitor 102, beyond the additional capacitance added by the first and second fingers 144*a* and 144*b* of the metal layer 126. FIG. 7 shows an example embodiment with two layers of interdigitated fingers. FIG. 8 shows an example embodiment with three layers of interdigitated fingers. Additional layers of interdigitated fingers can be include, and the circuit 100 can include any suitable number of layers of interdigitated fingers (e.g., 1 layer, 2 layers, 3 layers, 4 layers, 5 layers, 7 layers, 10 layers, or more, or any values or ranges between any of these values). The layers of interdigitated fingers can be coupled together to provide additional capacitance to the capacitor 102.

Figure 9:
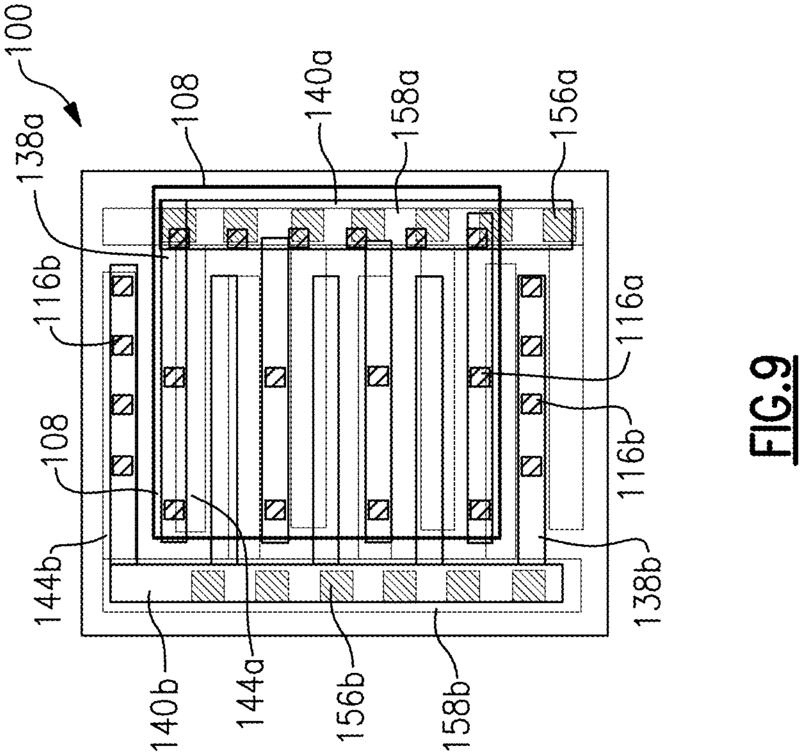
FIG. 9 is a cross-sectional plan view of an example embodiment of a circuit that includes a capacitor.

FIG. 9 is a cross-sectional plan view, with some features shown semi-transparent to facilitate the illustration of underlying features. The conductive layer 112 is omitted from view in FIG. 9. In FIG. 9, the semiconductor layer 108 is shown as a box with a thick line weight, the metal layer 114 (e.g., the first arms 138*a* and the second fingers 138*b*) are drawn with a relatively thick line weight, and the metal layer 126 (e.g., the first arms 144*a* and the second fingers 144*b*) are drawn with a relatively thin line weight. The first fingers 144*a* can extend from a first bus bar 158*a*, and the second fingers 144*b* can extend from the second bus bar 158*b*. The first bus bar 158*a* of layer 126 can be electrically coupled to the first bus bar 140*a* of layer 114, such as by one or more vias 156*a*, or another electrical interconnection feature. The second bus bar 158*b* of layer 126 can be electrically coupled to the second bus bar 140*b* of layer 114, such as by one or more vias 156*b*, or another electrical interconnection feature. The corresponding first portions of layers 114 and 126 can be electrically coupled in any suitable manner, and the corresponding second portions of the layers 114 and 126 can be electrically coupled in any suitable manner. In some embodiments, the first arms 144*a* of layer 126 can at least partially overlap the first fingers 138*a* of layer 114. One or more vias 156*a*, or other interconnections, can extend between one or more of the first fingers 144*a* of layer 126 and can one or more of the first fingers 138*a* of layer 114. The second fingers 144*b* of layer 126 can at least partially overlap the second fingers 138*b* of layer 114. One or more vias 156*b*, or other interconnections, can extend between one or more of the second fingers 144*b* of layer 126 and can one or more of the second fingers 138*b* of layer 114.

Figure 10:
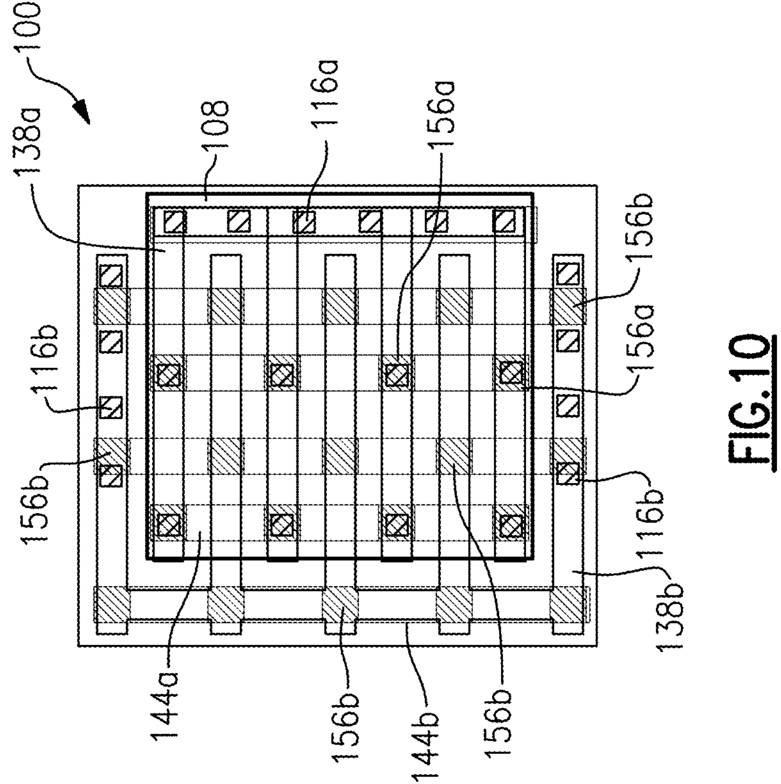
FIG. 10 is a cross-sectional plan view of an example embodiment of a circuit that includes a capacitor.

In FIG. 9, the first fingers 144*a* of layer 126 can be substantially parallel with the first fingers 138*a* of layer 114, and/or the second fingers 144*b* of layer 126 can be substantially parallel with the second fingers 138*b* of layer 114. With reference to FIG. 10, in some embodiments, the first arms 144*a* of layer 126 can be substantially perpendicular to the first fingers 138*a* of layer 114, and/or the second fingers 144*b* of layer 126 can be substantially perpendicular to the second fingers 138*b* of layer 114. In FIG. 10, the bus bars 158*a* and 158*b* can be omitted. The first fingers 144*a* of layer 126 can be positioned at any other suitable angle relative to the first fingers 138*a* of layer 114, and/or the second fingers 144*b* of layer 126 can be positioned at any other suitable angle relative to the second fingers 138*b* of layer 114.

Figures 11, 12:
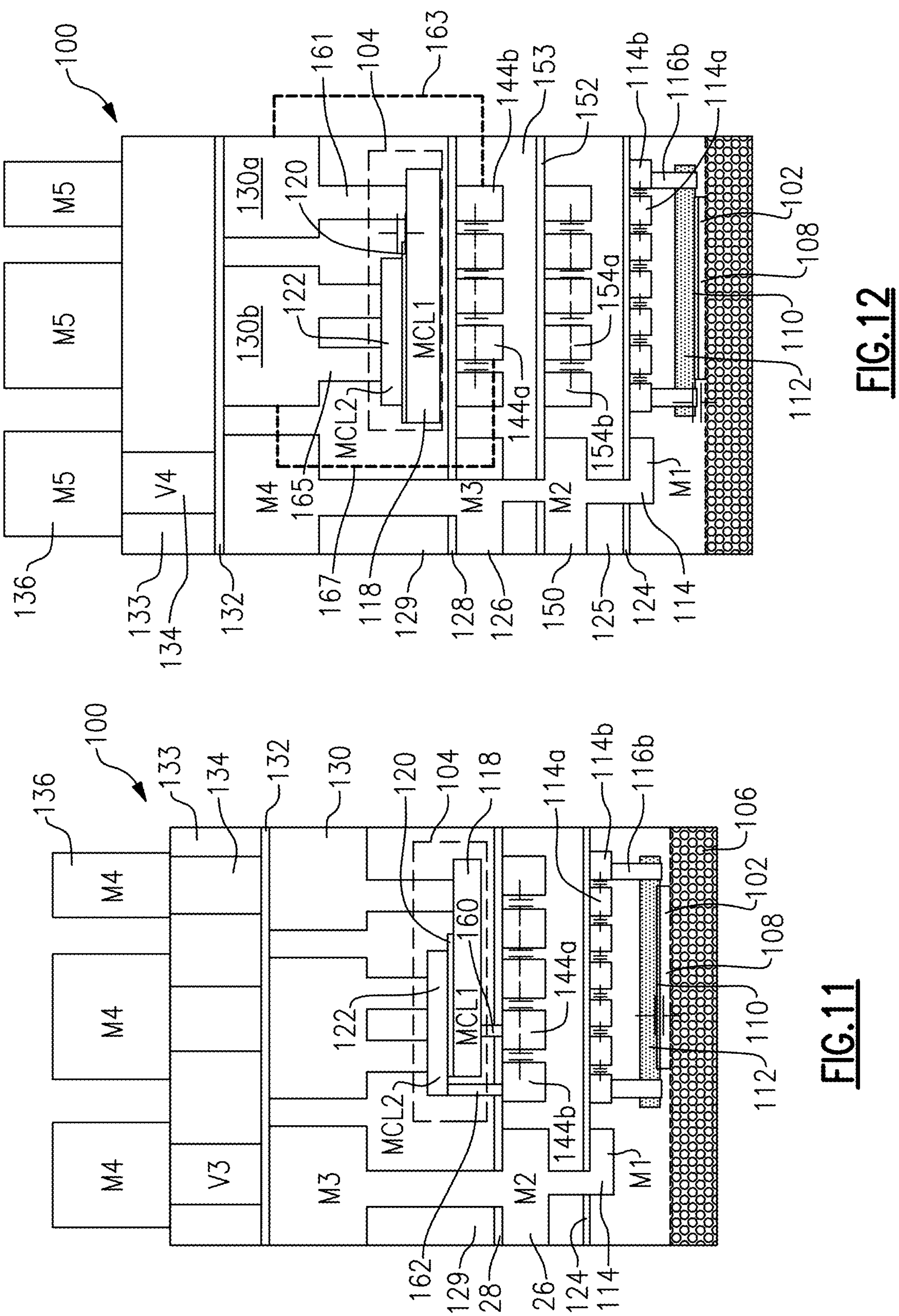
FIG. 11 is a cross-sectional side view of an example embodiment of a circuit that includes a capacitor.
FIG. 12 is a cross-sectional side view of an example embodiment of a circuit that includes a capacitor.

With reference to FIGS. 11 and 12, the interdigitated fingers can be electrically coupled to a second capacitor 104 in the circuit 100. The interdigitated fingers can electrically couple the first capacitor 102 to the second capacitor 104. Thus, in some embodiments, the first capacitor 102, the second capacitor 104, and the capacitance between the interdigitated fingers can cooperate to provide a high capacitance density for the circuit 100. FIG. 11 shows an example embodiment with two layers of interdigitated fingers, with the first or lower conductive layer 118 of the second capacitor 104 electrically coupled to at least one of the first fingers 144*a* of the layer 126. For example, a via 160 (e.g., shown as a solid line) can extend through the insulating layer 128 and/or a portion of the insulating material 129 to electrically couple the first finger 144*b* to the first conductive layer 118. The second or upper conductive layer 122 of the second capacitor 104 can be electrically coupled to at least one of the second fingers 144*b* of the layer 126. In some embodiments, a via 162 can electrically couple the second or upper conductive layer 122 of the second capacitor 104 to the second fingers 144*b*. The upper or second conductive layer 122 can extend past an edge of the first or lower conductive layer 118, so the via 162 can extend directly from the upper or second conductive layer 122, through the insulating layer 128 to one of the second fingers 144*b*. In some cases, a portion of the second or upper conductive layer 122 can overhang or extend laterally beyond the first or lower conductive layer 118, and via(s) 162 can be used to connect the one or more second fingers to the second or upper conductive layer 122. As discussed herein, the first fingers 114*a* of the layer 126 can be electrically coupled to the semiconductor layer 108 of the first capacitor 102, and the second fingers 114*b* of the layer 126 can be electrically coupled to the conductive layer 112. Thus, in the embodiment of FIG. 11, the first conductive layer 118 of the second capacitor 104 can be electrically coupled to the semiconductor layer 108 of the first capacitor 102, and the second conductive layer 122 of the second capacitor 104 can be electrically coupled to the conductive layer 112 of the first capacitor 102. Many variations are possible. For example, the example of FIG. 11 can be modified to include additional layers of interdigitated fingers, such as the fingers 154*a* and 154*b* of FIG. 12, or only one layer of interdigitated fingers, as shown in FIG. 3.

FIG. 12 shows an example embodiment with three layers of interdigitated fingers, with the first or lower conductive layer 118 of the second capacitor 104 electrically coupled to at least one of the second fingers 144*b* of the layer 126. A portion of the first or lower conductive layer 118 of the second capacitor 104 can extend laterally past an edge of the upper or second conductive layer 122, and a via 161 can extend upward from that portion of the lower conductive layer 118 up to a first portion 130*a* of the metal layer 130 (M4). One or more electrical pathways (e.g., formed in metal layer 130 and shown in FIG. 12 as a horizontal dashed line) can electrically couple the first portion 130*a* of the metal layer 130 to a via 163 (shown schematically in FIG. 12 as a vertical dashed line), which can extend down to the metal layer 126 (M3). One or more electrical pathways (e.g., formed in the metal layer 126 and shown in FIG. 12 as a horizontal dashed line) can electrically couple the via 163 to one or more of the second fingers 144*b*. The second or upper conductive layer 122 of the second capacitor 104 can be electrically coupled to at least one of the first fingers 144*a* of the layer 126. One or more vias 165 can extend upward from the upper or second conductive layer 122 to a second portion 130*b* of the metal layer 130 (M4). One or more electrical pathways (e.g., formed in metal layer 130 and shown in FIG. 12 as a horizontal dashed line) can electrically couple the second portion 130*b* of the metal layer 130 to a via 167 (shown schematically in FIG. 12 as a vertical dashed line), which can extend down to the metal layer 126 (M3). One or more electrical pathways (e.g., formed in the metal layer 126 and shown in FIG. 12 as a horizontal dashed line) can electrically couple the via 167 to one or more of the first fingers 144*a*. The vias 163 and 167 and the electrical pathways that are shown schematically as dashed lines in FIG. 12 can be located outside of the plane where the cross-section of FIG. 12 was taken, for example. As discussed herein, the first fingers 114*a* of the layer 126 can be electrically coupled to the semiconductor layer 108 of the first capacitor 102, and the second fingers 114*b* of the layer 126 can be electrically coupled to the conductive layer 112. Thus, in the embodiment of FIG. 12, the first conductive layer 118 of the second capacitor 104 can be electrically coupled to the conductive layer 112 of the first capacitor 102, and the second conductive layer 122 of the second capacitor 104 can be electrically coupled to the semiconductor layer 108 of the first capacitor 102.

Many variations are possible. Various types of capacitors can be used. In various embodiments, the first capacitor 102 is described as a MOSCAP, but it could by any other suitable type of capacitor, such as a MIMCAP or a metal-oxide-metal capacitor (MOMCAP). In some cases, the semiconductor layer 108 can be substituted for a conductive layer (e.g., a metal layer). The insulating materials discussed herein can be an oxide layer, such as silicon dioxide. In various embodiments, the second capacitor is described as being a MIMCAP, but it could be any other suitable type of capacitor, such as a MOSCAP or MOMCAP, etc. In some cases, the conductive layer 118 or 122 can be substituted for a semiconductor layer. The capacitors formed by the interdigitated fingers can be considered MOMCAPs, and an oxide material can be disposed between adjacent fingers, but any suitable type of capacitor could be used. Non-oxide insulating materials can be used, for example to electrically insulate the adjacent fingers from each other. The insulating material between the interdigitated fingers can be a dielectric material.

The interdigitated fingers can form one or more comb capacitors, which can increase the capacitance density of the circuit 100. By way of example, using one 35 volt comb capacitor formed by layer 114 (M1), such as the embodiment of FIG. 3, can increase the capacitance density by about 0.086 fF/μm$^2$ (femtofarad per micron squared) to about 0.212 fF/μm$^2$ (e.g., by about 0.149 fF/μm$^2$). Using one 35 volt comb capacitor formed by layer 150 (M2) can increase the capacitance density by about 0.078 fF/μm$^2$ to about 0.204 fF/μm$^2$ (e.g., by about 0.141 fF/μm$^2$). Using one 35 volt comb capacitor formed by layer 126 (MT) can increase the capacitance density by about 0.095 fF/μm$^2$ to about 0.249 fF/μm$^2$ (e.g., by about 0.12 fF/μm$^2$). Using two 35 volt comb capacitors formed by layers 114 (M1) and 150 (M2) can increase the capacitance density by about 0.2 fF/μm$^2$ to about 0.38 fF/μm$^2$ (e.g., by about 0.29 fF/μm$^2$). Using two 35 volt comb capacitors formed by layers 114 (M1) and 126 (MT) (e.g., as shown in FIG. 7) can increase the capacitance density by about 0.215 fF/μm$^2$ to about 0.409 fF/μm$^2$ (e.g., by about 0.312 fF/μm$^2$). Using two 35 volt comb capacitors formed by layers 150 (M2) and 125 (MT) can increase the capacitance density by about 0.209 fF/μm$^2$ to about 0.407 fF/μm$^2$ (e.g., by about 0.308 fF/μm$^2$). Using three 35 volt comb capacitors formed by layers 114 (M1), 150 (M2), and 126 (MT) (e.g., as shown in FIG. 8) can increase the capacitance density by about 0.327 fF/μm$^2$ to about 0.557 fF/μm$^2$ (e.g., by about 0.442 fF/μm$^2$). Various other configurations could be used to provide different capacitance densities that are below or above these values and ranges. For example, additional layers of comb capacitors could be used, or additional fingers could be used, and/or smaller gaps between fingers could be used, which can increase the capacitance density. The second capacitor 104 can provide an additional capacitance density increase of about 1 fF/μm$^2$ to about 3 fF/μm$^2$ (e.g., about 2 fF/μm$^2$), although other values could result depending on the parameters of the second capacitor 104.

The interdigitated fingers can provide a capacitance that is about 3%, about 5%, about 7%, about 10%, about 12%, about 15%, about 18%, about 20%, about 25% about 30%, about 35%, about 40%, about 45%, about 50%, about 55%, about 60%, about 65%, about 70%, about 75%, or more of the capacitance provided by the first capacitor 102, or any values or ranges between any of these values, although other configurations are possible. The interdigitated fingers can provide a capacitance that is about 3%, about 5%, about 7%, about 10%, about 12%, about 15%, about 18%, about 20%, about 25% about 30%, about 35%, about 40%, about 45%, about 50%, about 55%, about 60%, about 65%, about 70%, about 75%, or more of the capacitance provided by the second capacitor 104, or any values or ranges between any of these values, although other configurations are possible. In some embodiments, the additional capacitance provided by the interdigitated fingers can increase the capacitance without increasing the area footprint, so that the capacitance density is increased. By way of example, an embodiment can have a MOSCAP with a capacitance density of about 3 fF/μm$^2$. Adding an M1 layer of interdigitated fingers can increase the capacitance density to about 3.288 fF/μm$^2$. Adding the M1 and M2 layers of interdigitated fingers can increase the capacitance density to about 3.363 fF/μm$^2$. Adding the M1 and M2 layers of interdigitated fingers, and the second capacitor 104 (e.g., a MIMCAP) can increase the capacitance density to about 5.184 fF/μm$^2$. Additional layers of interdigitated fingers can be included, which can further increase the capacitance density.

In some embodiments the second capacitor 104 can be omitted. In some embodiments, the first capacitor 102 can be omitted. The one or more layers of interdigitated fingers can be coupled to the second capacitor 104, such as to increase the capacitance associated with the second capacitor 102. By way of example, an embodiment can have a MIMCAP with a capacitance density of about 1.63 fF/μm$^2$. Adding an M1 layer of interdigitated fingers can increase the capacitance density to about 1.918 fF/μm$^2$. Adding the M1 and M2 layers of interdigitated fingers can increase the capacitance density to about 2.184 fF/μm$^2$.

In some cases, when multiple capacitive elements are combined together the total breakdown voltage of the capacitive assembly can be the breakdown voltage set by the component with the lowest breakdown voltage. With reference to FIG. 11, for example, the first capacitor 102 (e.g., a MOSCAP), the second capacitor 104 (e.g., a MIMCAP), and the comb-type capacitor formed by the interdigitated fingers (e.g., which can be considered a MOMCAP in some cases), can contribute capacitance to form a joint capacitive assembly. The breakdown voltage of the joint capacitive assembly can be lowest breakdown voltage of the three components. Generally, the insulating or dielectric layers of a MIMCAP and a MOMCAP are thicker than the insulating (e.g., oxide) layer of the MOSCAP. In some embodiments, the breakdown voltage of the capacitive assembly can be set by the first capacitor 102, even if the second capacitor 104 and/or the interdigitated capacitor would have higher breakdown voltages on their own. In some embodiments, it can be beneficial to provide a MOSCAP design with an increased breakdown voltage, so as to raise the breakdown voltage of the whole capacitive assembly.

Figure 13A:
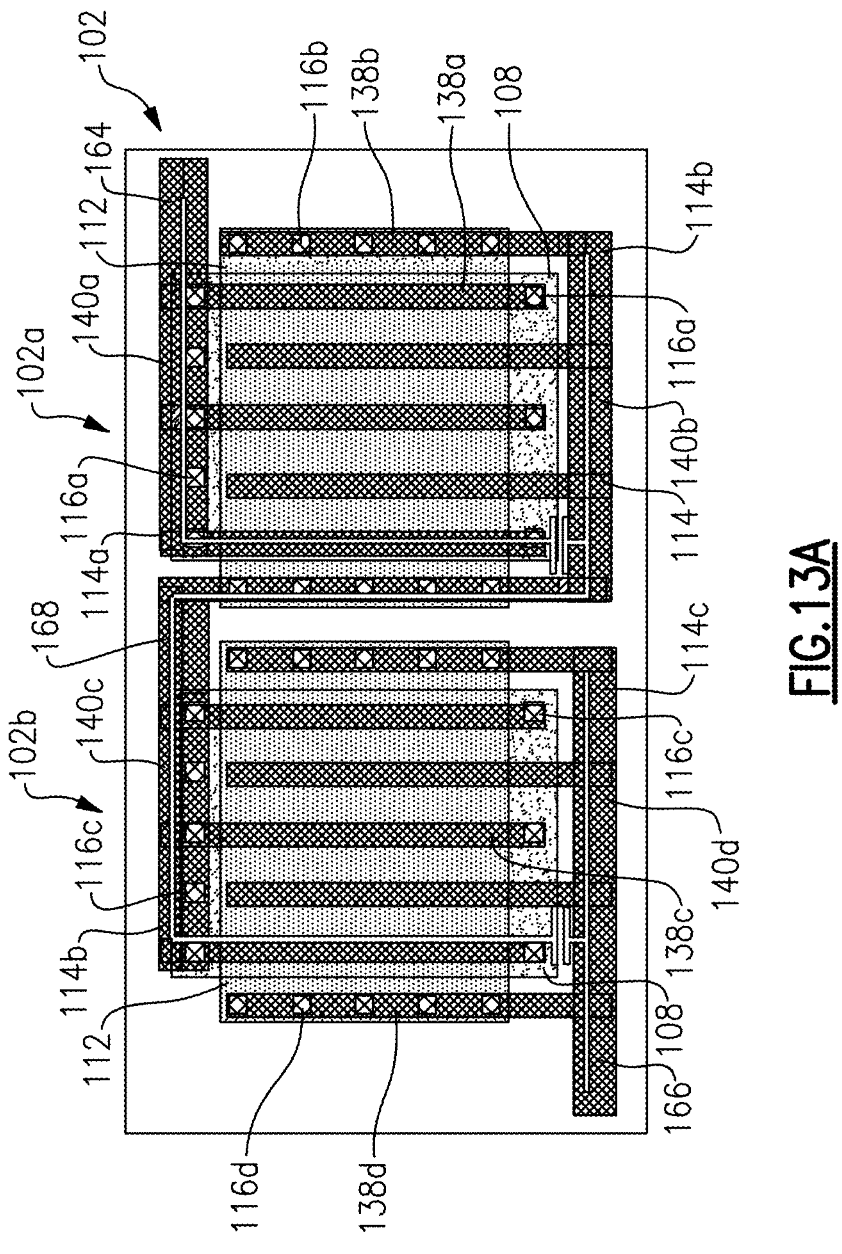
FIG. 13A is a cross-sectional plan view of an example embodiment of a circuit that includes a capacitor.

FIG. 13A shows an example embodiment of a capacitor 102 design, which can be have an increased breakdown voltage. With reference to FIG. 13A, the circuit 100 can include a plurality of capacitors 102*a* and 102*b*, which can be coupled in series. The capacitors 102*a*, 102*b* can be MOSCAPs, although any suitable type of capacitor can be used. FIG. 13A shows two capacitors 102*a*, 102*b* coupled in series, but any suitable number of capacitors can be coupled in series (e.g., 2, 3, 4, 5, 7, 10, or more, or any values or ranges therebetween). The capacitors 102*a*, 102*b* can be arranged side-by-side linearly, or in a grid format, or in any other suitable arrangement. Each of the capacitors 102*a*, 102*b* can be similar to the first capacitor 102 in other embodiments disclosed herein. The capacitors 102*a*, 102*b* can include one or more layers of interdigitated fingers, which can increase the capacitance density of the capacitors 102*a*, 102*b*.

The capacitors 102*a*, 102*b* can each have a first layer 108 that can be a conductive or semiconductor material, and a second layer 112 that can be a conductive material. An insulating layer (not visible in FIG. 13A) or material can be between the first layer 108 and the second layer 112. The insulating layer can be an oxide, such as SiO2, or any other suitable insulating material. The first capacitor portion 102*a* can include a first plurality of fingers 138*a*, which can be electrically coupled to the first layer 108 of the first capacitor 102*a*, such as by one or more vias 116*a*. The capacitor 102*a* can include a second plurality of fingers 138*b*, which can be electrically coupled to the second layer 112 of the first capacitor 102*a*, such as by one or more vias 116*b*. The first plurality of fingers 138*a* can be interdigitated with the second plurality of fingers 138*b*, which can form a comb-type capacitor element, which can add to the capacitance of the underlying capacitor element 102*a* (e.g., a MOSCAP or plate-type capacitor, etc.). The first fingers 138*a* can extend in a first direction from a first bus bar 140*a*. The second fingers 138*b* can extend from a second bus bar 140*b* in a second direction that is substantially opposite the first direction.

The second capacitor portion 102*b* can include a third plurality of fingers 138*c*, which can be electrically coupled to the first layer 108 of the second capacitor 102*b*, such as by one or more vias 116*c*. The second capacitor 102*b* can include a fourth plurality of fingers 138*d*, which can be electrically coupled to the second layer 112 of the second capacitor 102*b*, such as by one or more vias 116*d*. The third plurality of fingers 138*c* can be interdigitated with the fourth plurality of fingers 138*d*, such as to form a comb-type capacitor element, which can add to the capacitance of the underlying capacitor element 102*b* (e.g., a MOSCAP or plate-type capacitor, etc.). The third fingers 138*c* can extend in a first direction from a third bus bar 140*c*. The fourth fingers 138*d* can extend from a fourth bus bar 140*d* in a second direction that is substantially opposite the first direction. The third fingers 138*c* can extend in substantially the same direction as the first finger 138*a*. The fourth fingers 138*d* can extend in the substantially the same direction as the second fingers 138*b*.

The first and second capacitor portions 102*a* and 102*b* can be coupled in series, as shown in FIG. 13A. A conductive interconnection line 168 can extend from one of the second fingers 138*b* to the third bus bar 140*c*, for example. The interconnection line 168 can be formed of the metal layer 114 (e.g., along with the interdigitated fingers). The capacitor portions 102*a* and 102*b* can be interconnection in various other suitable manners. For example, a conductive interconnection line can extend from one of the first arms 138*b* to one of the third arms 138*c*. The second fingers 138*b* and the third fingers 138*c* can both be formed by patterns in the same continuous portion 114*b* of the metal layer 114. The first arms 138*a* can be made from portion 114*a*, which is insulated from the portion 114*b*. The fourth arms 138*d* can be made from portion 114*c*, which is insulated from the portions 114*a* and/or 114*b*. The second layer 112 of the first capacitor portion 102*a* can be electrically coupled to the first layer 108 of the second capacitor portion 102*b*. The capacitor portions 102*a* and 102*b* can have opposite polarities. A first connection line 164 can be coupled to the first fingers 138*a*. For example, the first connection line 164 can extend from the first bus bar 140*a*. A second connection line 166 can be coupled to the fourth fingers 138*d*. For example, the fourth connection line 166 can extend form the fourth bus bar 140*d*. Electrical power, signals, and/or charge can be provided to, or received from, the capacitor 102. The anode of the first capacitor portion 102*a* can be electrically coupled to the cathode of the second capacitor portion 102*b*. In another embodiments, the cathode of a first capacitor portion can be electrically coupled to the anode of a second capacitor portion.

The capacitor 102 can include any suitable number capacitor elements (e.g., 2, 3, 4, 5, 7, 10, 12, 16, 20, or more, or any values or ranges therebetween). Adjacent capacitor elements 102*a-b* can have opposite polarities. For example, if a third capacitor element were added and were connected to the second capacitor element 102*b*, the fourth arms 138*d* (e.g., which are electrically coupled to the second layer 112) can be electrically connected to the arms on the third capacitor element that are electrically coupled the first layer 108, so that the third capacitor element can have a polarity similar to the polarity of the first capacitor element 102*a*. Additional capacitor elements can be added, such as with alternating polarities. In some cases, the capacitor elements can be arranged in a 2D grid format, and a capacitor element can have the opposite polarity of the adjacent capacitor elements. In some configurations, the capacitor 102 with two capacitor elements 102*a* and 102*b* that are coupled in series can have breakdown voltage that is equal or similar to double the breakdown voltage of a single one of the capacitor elements 102*a* and 102*b*.

The configuration of FIG. 13A, with the two or more capacitor elements 102*a* and 102*b* can have a higher breakdown voltage than either of the capacitor components 102*a* and 102*b* alone. The two or more capacitors elements 102*a* can be used as the capacitor 102 (e.g., the MOSCAP) of other embodiments disclosed herein, which can result in a capacitor assembly with an increased overall breakdown voltage.

Figure 13B:
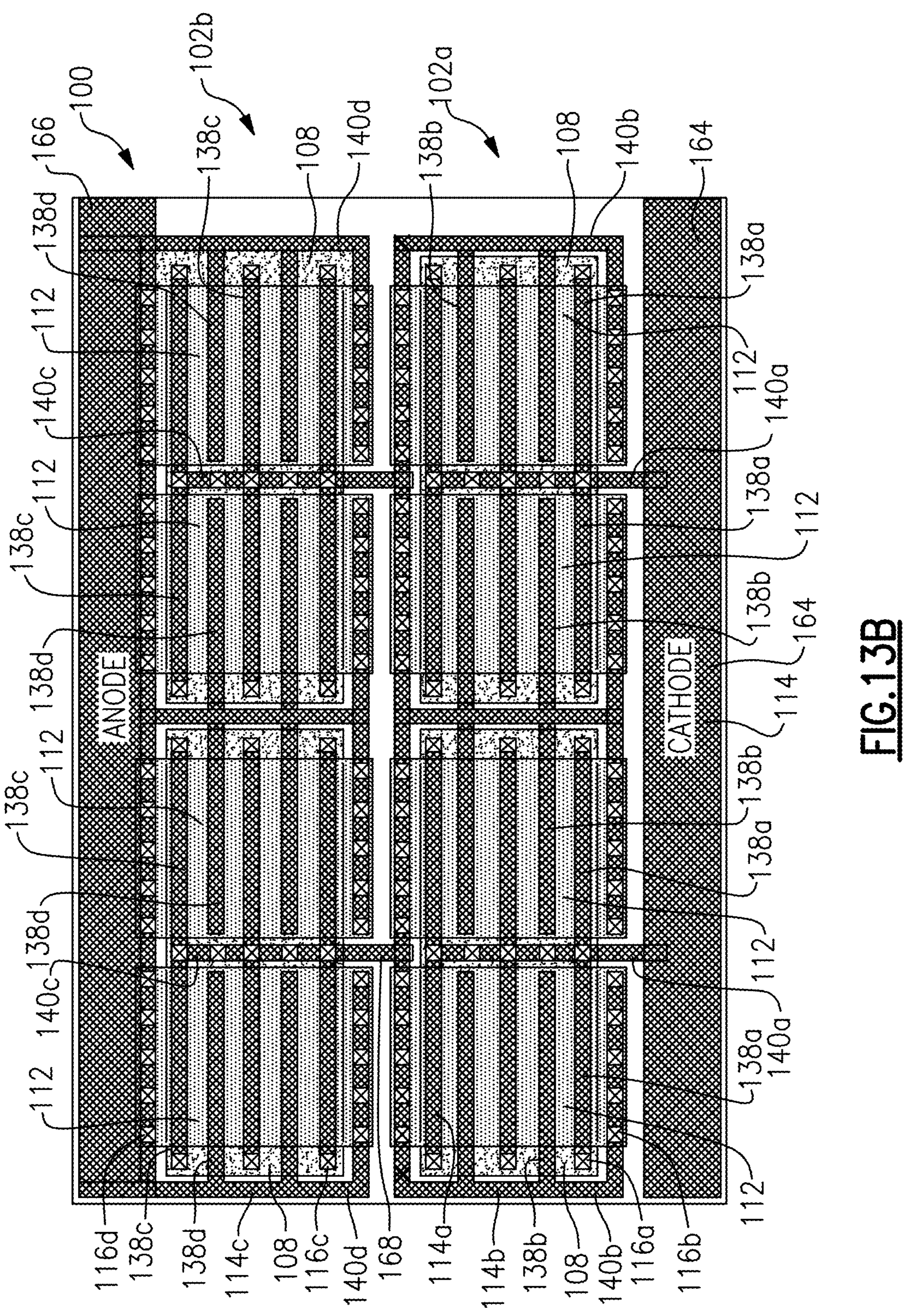
FIG. 13B is a cross-sectional plan view of an example embodiments of a circuit that includes a capacitor.

FIG. 13B shows another example embodiment of a circuit 100 with a capacitor 102, which can be have an increased breakdown voltage. With reference to FIG. 13B, the circuit 100 can include a plurality of capacitor portions 102*a* and 102*b*, which can be coupled in series. The capacitor portions 102*a*, 102*b* can be MOSCAPs, although any suitable type of capacitor can be used. FIG. 13B shows two capacitors 102*a*, 102*b* coupled in series, but any suitable number of capacitor portions can be coupled in series (e.g., 2, 3, 4, 5, 7, 10, or more, or any values or ranges therebetween). Although FIG. 13B shows one layer of interdigitated fingers, the capacitor portions 102*a*, 102*b* can include additional layers of interdigitated fingers, which can increase the capacitance density.

The capacitor portions 102*a*, 102*b* can each have a first layer 108 that can be a conductive or semiconductor material, and a second layer 112 that can be a conductive material. An insulating layer (not visible in FIG. 13B) or material can be between the first layer 108 and the second layer 112. The insulating layer can be an oxide, such as SiO2, or any other suitable insulating or dielectric material. The first capacitor portion 102*a* can have two portions of the first layer 108, which can be separated by an insulating material. In some embodiments, the first capacitor portion 102*a* can have a single first layer portion 108. For example the two first layer portions 108 of the first capacitor portion 102*a* shown in FIG. 13B can be modified to be a single first layer portion 108. The second capacitor portion 102*b* can have two portions of the first layer 108, which can be separated by an insulating material. In some embodiments, the second capacitor portion 102*b* can have a single first layer portion 108. For example the two first layer portions 108 of the second capacitor portion 102*b* shown in FIG. 13B can be modified to be a single first layer portion 108. The first capacitor portion 102*a* can have four portions of the second layer 112, which can be separated by an insulating material. In some embodiments, the first capacitor portion 102*a* can have one, two, three, four, or any suitable number of second layer portions 112. The second capacitor portion 102*b* can have four portions of the second layer 112, which can be separated by an insulating material. In some embodiments, the second capacitor portion 102*b* can have one, two, three, four, or any suitable number of second layer portions 112.

The first capacitor portion 102*a* can include a first plurality of fingers 138*a*, which can be electrically coupled to the first layer 108 of the first capacitor 102*a*, such as by one or more vias 116*a*. The capacitor 102*a* can include a second plurality of fingers 138*b*, which can be electrically coupled to the second layer 112 of the first capacitor 102*a*, such as by one or more vias 116*b*. The first plurality of fingers 138*a* can be interdigitated with the second plurality of fingers 138*b*, as discussed herein. The first capacitor portion 102*a* of FIG. 13B can have four sets of interdigitated fingers 138*a* and 138*b*. Any suitable number of sets of interdigitated fingers 138*a* and 138*b* can be used (e.g., 1, 2, 3, 4, 6, 8, 10, 12, or more sets, or any values or ranges therebetween). In some cases, sets of first fingers 138*a* can extend from two opposing sides of a bus bar 140*a*. In some cases, sets of second fingers 138*b* can extend from two opposing sides of a bus bar 140*b*. In the example of FIG. 13B, the first capacitor portion 102*a* has two first bus bars 140*a*, which each have two sides of first fingers 138*a* on respective sides of the bus bars 140*a*, thereby providing four sets of first fingers 138*a*. The first capacitor portion 102*a* has three second bus bars 140*b*, with one bus bar 140*b* having two sets of second fingers 138*b* extending from respective sides, and with two bus bars 140*c* each having one set of second fingers 138*b*, thereby providing four sets of second fingers 138*b*.

The second capacitor portion 102*b* can include a third plurality of fingers 138*c*, which can be electrically coupled to the first layer 108 of the second capacitor 102*b*, such as by one or more vias 116*c*. The second capacitor 102*b* can include a fourth plurality of fingers 138*d*, which can be electrically coupled to the second layer 112 of the second capacitor 102*b*, such as by one or more vias 116*d*. The third plurality of fingers 138*c* can be interdigitated with the fourth plurality of fingers 138*d*, as discussed herein. The second capacitor portion 102*b* of FIG. 13B can have four sets of interdigitated fingers 138*c* and 138*d*. Any suitable number of sets of interdigitated fingers 138*c* and 138*d* and be used (e.g., 1, 2, 3, 4, 6, 8, 10, 12, or more sets, or any values or ranges therebetween). In some cases, sets of third fingers 138*c* can extend from two opposing sides of a bus bar 140*c*. In some cases, sets of fourth fingers 138*d* can extend from two opposing sides of a bus bar 140*d*. In the example of FIG. 13B, the second capacitor portion 102*b* has two third bus bars 140*c*, which each have two sides of third fingers 138*c* on respective sides of the bus bars 140*c*, thereby providing four sets of third fingers 138*c*. The second capacitor portion 102*b* has three fourth bus bars 140*d*, with one bus bar 140*d* having two sets of fourth fingers 138*d* extending from respective sides, and with two bus bars 140*d* each having one set of fourth fingers 138*d*, thereby providing four sets of fourth fingers 138*d*.

The first and second capacitor portions 102*a* and 102*b* can be coupled in series, as shown in FIG. 13B. One or more conductive interconnection lines 168 can couple the second arms 138*b* to the third arms 138*c*. In FIG. 13B, two interconnection lines can be used. The interconnection line 168 can couple a second bus bar 140*b* to a third bus bar 140*c*. The interconnection line 168 can couple one or more second fingers 138*b* to a third bus bar 140*c*. The interconnection line 168 can couple a second bus bar 140*b* to one or more of the third fingers 138*c*. The interconnection line 168 can be formed of the metal layer 114 (e.g., along with the interdigitated fingers). The capacitor portions 102*a* and 102*b* can be interconnection in various other suitable manners. For example, a conductive interconnection line can extend from one of the first arms 138*b* to one of the third arms 138*c*. The second fingers 138*b* and the third fingers 138*c* can both be formed by patterns in the same continuous portion 114*b* of the metal layer 114. The first arms 138*a* can be made from portion 114*a*, which is insulated from the portion 114*b*. The fourth arms 138*d* can be made from portion 114*c*, which is insulated from the portions 114*a* and/or 114*b*. The second layer 112 of the first capacitor portion 102*a* can be electrically coupled to the first layer 108 of the second capacitor portion 102*b*. The capacitor portions 102*a* and 102*b* can have opposite polarities. A first connection line 164 can be coupled to the first fingers 138*a*. For example, the first connection line 164 can extend from or be electrically coupled to the first bus bar 140*a*. A second connection line 166 can be coupled to the fourth fingers 138*d*. For example, the fourth connection line 166 can extend form or be electrically coupled to the fourth bus bar 140*d*. Electrical power, signals, and/or charge can be provided to, or received from, the capacitor 102. The anode of the first capacitor portion 102*a* can be electrically coupled to the cathode of the second capacitor portion 102*b*. In another embodiments, the cathode of a first capacitor portion can be electrically coupled to the anode of a second capacitor portion.

Figure 13C:
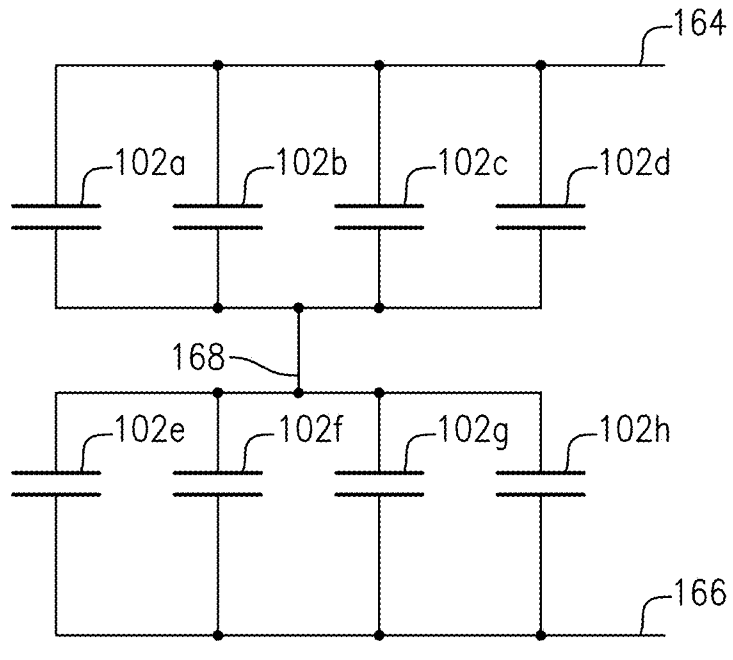
FIG. 13C is a schematic diagram of an example embodiment with eight capacitor elements.

FIG. 13C is a schematic diagram of an example embodiment similar to the embodiment of FIG. 13B. The capacitor 102 can have eight capacitor elements 102*a-h*. Each set of capacitor elements 102*a-h* can have a set of interdigitated fingers 138*a* and 138*b*, which can be arranged as shown in FIG. 13B, for example. A first set of four capacitor elements 102*a-d* can be coupled in parallel with each other. A second set of four capacitor elements 102*e-h* can be coupled in parallel with each other. The first set of four capacitor elements 102*a-d* can be coupled in series with the second set of four capacitor elements 102*e-h*, such as by one or more interconnection lines 168. A first connection line 164 can be coupled to the first set of capacitor elements 102*a-d*. A second connection line 164 can be coupled to the second set of capacitor elements 102*e-h*. Although FIGS. 13B and 13C show eight capacitor elements, any suitable number of capacitor elements (with associated interdigitated fingers) can be used, with a first set of the capacitor elements coupled in series to a second set of the capacitor elements, similar to FIG. 13C, for example. By way of example, 2, 4, 6, 8, 10, 12, 16, 20, 24, 32, 48, or more capacitor elements can be used.

Figure 14:
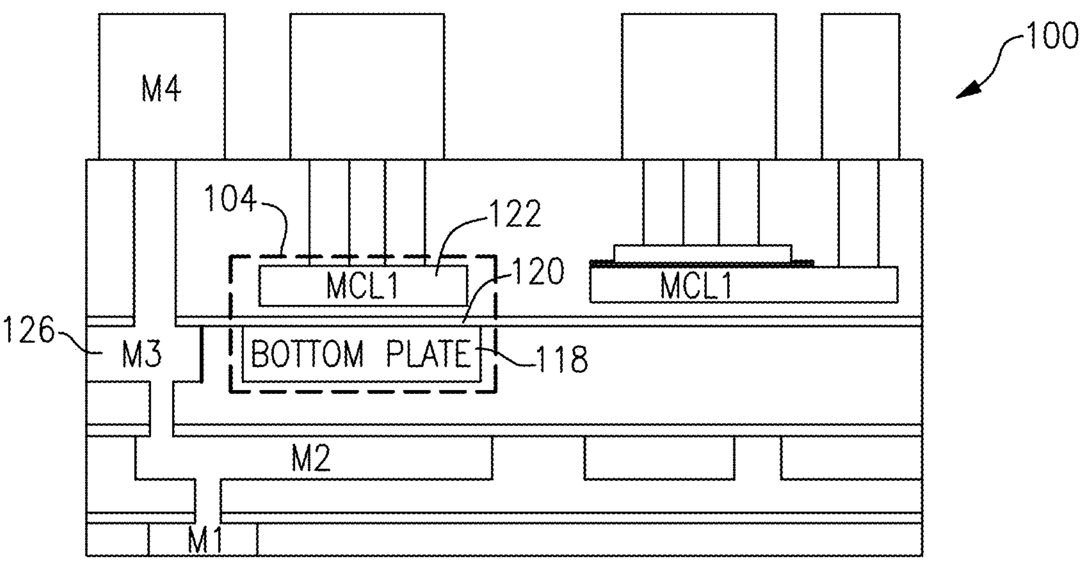
FIG. 14 is a cross-sectional side view of an example embodiment of a circuit that includes a capacitor.

FIG. 14 shows another example embodiment of a circuit 100, which can have features similar to the other embodiments described herein. The capacitor 104 (e.g., the MIMCAP) can have a first conductive layer 118, which can be the same metal material as the interconnection pathway described herein. The first conductive layer 118 can be made by depositing the layer of metal 126, and patterning the layer of metal 126 (e.g., by etching, lithography, or any other suitable manner) to provide the lower conductor 118 or bottom plate of the capacitor 104. This approach can facilitate the coupling of the lower conductor 118 to the underlying interdigitated fingers, such as be using one or more vias. The capacitor design of the capacitor 104 in FIG. 14 can be used in connection with any other suitable embodiment disclosed herein, such as be replacing the capacitor 104 of another embodiment.

Figure 15:
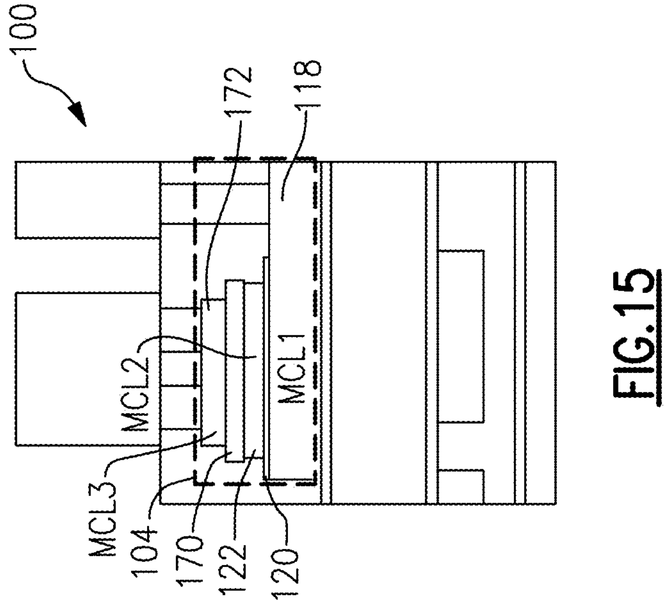
FIG. 15 is a cross-sectional side view of an example embodiment of a circuit that includes a capacitor.

FIG. 15 shows another example embodiment of a circuit 100, which can have features similar to the other embodiments described herein. The capacitor 104 (e.g., the MIMCAP) can have additional layers, such as to provide more capacitance. The capacitor 104 can have a first conductor layer 118, a first insulating (e.g., dielectric) layer 120, a second conductive layer 122, a second insulating (e.g., dielectric) layer 170, and a third conductive layer 172. Additional insulating and conductive layers can be added to further increase the capacitance. The capacitor design of the capacitor 104 in FIG. 15 can be used in connection with any other suitable embodiment disclosed herein, such as be replacing the capacitor 104 of another embodiment.

Figure 16:
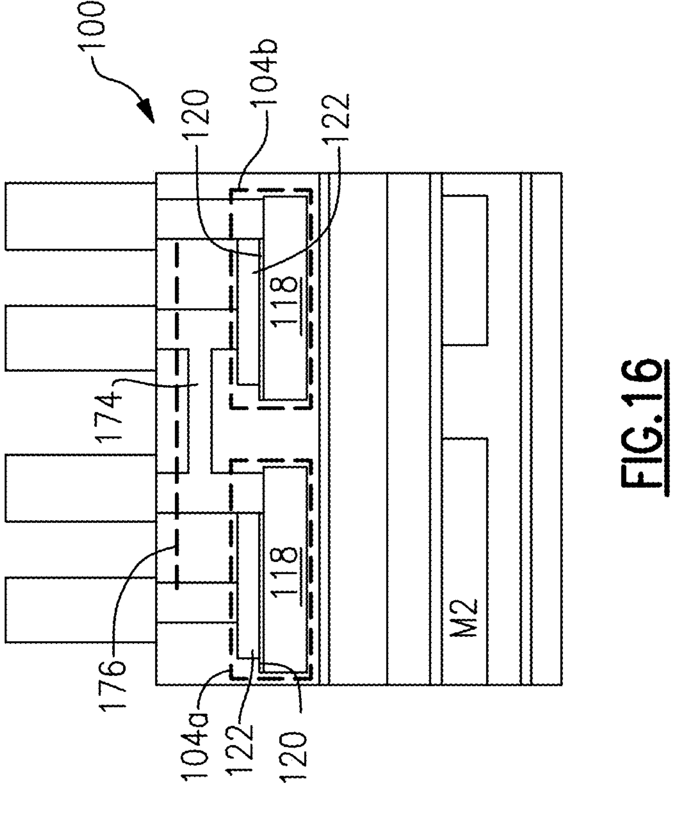
FIG. 16 is a cross-sectional side view of an example embodiment of a circuit that includes a capacitor.

FIG. 16 shows another example embodiment of a circuit 100, which can have features similar to the other embodiments described herein. The capacitor 104 (e.g., the MIMCAP) can have a first capacitor element 104*a* and a second capacitor element 104*b*. The capacitor elements 104*a*, 104*b* can be positioned side-by-side. The capacitor elements 104*a*, 104*b* can be made from insulated portions of the same lower conductive, dielectric, and upper conduct layers. The capacitor elements 104*a*, 104*b* can be coupled in series. The lower conductor 118 of the first capacitor element 104*a* can be electrically coupled to the upper conductor 122 of the second capacitor element 104*b*, such as by an electrical interconnection 174, which can be a metal pathway formed in another layer of the multi-layered circuit structure. The upper conductor 122 of the first capacitor element 104*a* can be electrically coupled to the lower conductor 118 of the second capacitor element 104*b*, such as by an electrical interconnection 176 (e.g., shown schematically in FIG. 16 as a dashed line), which can be a metal pathway formed in another layer of the multi-layered circuit structure. This configuration can increase the breakdown voltage of the capacitor assembly 104 as compared to a single capacitor element 104*a* or 104*b*. The capacitor design of the capacitor 104 in FIG. 16 can be used in connection with any other suitable embodiment disclosed herein, such as be replacing the capacitor 104 of another embodiment.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

While certain embodiments have been described, these embodiments have been presented by way of example only, and are not intended to limit the scope of the disclosure. Indeed, the novel devices, modules, apparatus, methods, and systems described herein may be embodied in a variety of other forms. Furthermore, various omissions, substitutions and changes in the form of the devices, modules, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A circuit comprising:

a first capacitor that has a semiconductor layer, an insulating layer over the semiconductor layer, and a conductive layer over the insulating layer, the conductive layer having an opening in a center region;

a first insulating layer over the conductive layer of the first capacitor;

a first metal layer over the first insulating layer, the first metal layer having a first portion that has a first plurality of fingers, and a second portion that has a second plurality of fingers that are interdigitated with the first plurality of fingers;

one or more first electrical connections that extend through the opening in the conductive layer to electrically couple the first portion of the first metal layer to the semiconductor layer of the first capacitor through the first insulating layer; and one or more second electrical connections that electrically couple the second portion of the first metal layer to the conductive layer of the first capacitor through the first insulating layer.

2. The circuit of claim 1 wherein the first capacitor is a metal-oxide-semiconductor capacitor.

3. The circuit of claim 1 wherein the conductive layer of the first capacitor overlaps the semiconductor layer of the first capacitor at an area that also overlaps one or more of the first plurality of fingers and one or more of the second plurality of fingers.

4. The circuit of claim 3 wherein the first plurality of fingers extend fully across the area where the conductive layer overlaps the semiconductor layer.

5. The circuit of claim 3 wherein the one or more first electrical connections connect to a portion of the semiconductor layer of the first capacitor that extends laterally past an edge of the conductive layer of the first capacitor.

6. The circuit of claim 1 further comprising:

a second insulating layer over the first metal layer;

a second metal layer over the second insulating layer, the second metal layer having a first portion that has a third plurality of fingers and a second portion that has a fourth plurality of fingers that are interdigitated with the third plurality of fingers;

one or more third electrical connections that electrically couple the first portion of the second metal layer to the first portion of the first metal layer; and one or more fourth electrical connections that electrically couple the second portion of the second metal layer to the second portion of the first metal layer.

7. The circuit of claim 6 wherein the third plurality of fingers extend along a direction that is substantially parallel to a direction that the first plurality of fingers extend along.

8. The circuit of claim 6 wherein the third plurality of fingers extend along a direction that is substantially perpendicular to a direction that the first plurality of fingers extend along.

9. The circuit of claim 6 further comprising:

a third insulating layer over the second metal layer;

a third metal layer over the third insulating layer, the third metal layer having a first portion that has a fifth plurality of fingers and a second portion that has a sixth plurality of fingers that are interdigitated with the fifth plurality of fingers;

one or more fifth electrical connections that electrically couple the first portion of the third metal layer to the first portion of the second metal layer; and one or more sixth electrical connections that electrically couple the second portion of the third metal layer to the second portion of the second metal layer.

10. The circuit of claim 1 wherein the first portion of the first metal layer is electrically coupled to a first external electrical contact, and the second portion of the first metal layer is electrically coupled to a second external electrical contact.

11. The circuit of claim 1 wherein a capacitance provided by the interdigitated first and second pluralities of fingers is at least about 3% of a capacitance provided by the first capacitor.

12. The circuit of claim 1 wherein a capacitance provided by the interdigitated first and second pluralities of fingers is at least about 5% of a capacitance provided by the first capacitor.

13. The circuit of claim 1 wherein a capacitance provided by the interdigitated first and second pluralities of fingers is at least about 10% of a capacitance provided by the first capacitor.

14. A method of making a circuit, the method comprising:

forming a semiconductor layer over a substrate;

forming a dielectric layer over the semiconductor layer;

forming a conductive layer over the dielectric layer to provide a capacitor, the conductive layer having an opening in a center region;

forming an insulating layer over the conductive layer; and forming a first metal layer over the insulating layer, the first metal layer having a first portion and a second portion that is insulated from the first portion, the first portion electrically coupled to the semiconductor layer with one or more electrical connections that extend through the opening in the conductive layer, the first portion having a first plurality of fingers, and the second portion electrically coupled to the conductive layer and having a second plurality of fingers that are interdigitated with the first plurality of fingers.

15. The method of claim 14 wherein a footprint of the interdigitated first and second plurality of fingers overlaps with a footprint of the capacitor.

16. The method of claim 14 further comprising:

forming a second insulating layer over the first metal layer; and forming a second metal layer over the second insulating layer, the second metal layer having a first portion and a second portion that is insulated from the first portion, the first portion of the second metal layer electrically coupled to the first portion of the first metal layer and having a third plurality of fingers, the second portion of the second metal layer electrically coupled to the second portion of the first metal layer and having a fourth plurality of fingers that are interdigitated with the third plurality of fingers.

17. The method of claim 16 wherein the third plurality of fingers extend along a direction that is substantially parallel to a direction that the first plurality of fingers extend along.

18. The method of claim 16 wherein the third plurality of fingers extend along a direction that is substantially perpendicular to a direction that the first plurality of fingers extend along.

19. The method of claim 16 further comprising:

forming a third insulating layer over the second metal layer; and forming a third metal layer over the third insulating layer, the third metal layer having a first portion and a second portion that is insulated from the first portion, the first portion of the third metal layer electrically coupled to the first portion of the second metal layer and having a fifth plurality of fingers, the second portion of the third metal layer electrically coupled to the second portion of the second metal layer and having a sixth plurality of fingers that are interdigitated with the fifth plurality of fingers.

20. A capacitor comprising:

a cathode layer;

an anode layer with an opening in a center region;

an insulating layer between the cathode layer and the anode layer;

a first plurality of fingers that are electrically coupled to the cathode layer with one or more electrical connectors that extend through the opening in the anode layer; and a second plurality of fingers that are electrically coupled to the anode layer, the second plurality of fingers interdigitated with the first plurality of fingers to increase capacitance of the capacitor.

21. The capacitor of claim 20 wherein the cathode layer is a semiconductor material, the insulating layer is an oxide material, and the anode layer is a metal material.

22. The capacitor of claim 20 wherein the cathode layer is substantially planar, the anode layer is substantially planar, a first line normal to the cathode and anode layers intersects the cathode layer, the anode layer, and one of the first plurality of fingers, and a second line normal to the cathode and anode layers intersects the cathode layer, the anode layer, and one of the second plurality of fingers.

23. The capacitor of claim 20 further comprising:

a third plurality of fingers that are electrically coupled to the cathode layer; and a fourth plurality of fingers that are electrically coupled to the anode layer, the fourth plurality of fingers are interdigitated with the third plurality of fingers to increase the capacitance of the capacitor.

24. The capacitor of claim 23 wherein the cathode layer is substantially planar, the anode layer is substantially planar, a first line normal to the cathode and anode layers intersects the cathode layer, the anode layer, one of the first plurality of fingers, and one of the third plurality of fingers, and a second line normal to the cathode and anode layers intersects the cathode layer, the anode layer, one of the second plurality of fingers, and one of the fourth plurality of fingers.

25. The capacitor of claim 23 wherein the third plurality of fingers extend along a direction that is substantially parallel to a direction that the first plurality of fingers extend along.

26. The capacitor of claim 23 wherein the third plurality of fingers extend along a direction that is substantially perpendicular to a direction that the first plurality of fingers extend along.

27. The capacitor of claim 23 further comprising:

a fifth plurality of fingers that are electrically coupled to the cathode layer; and a sixth plurality of fingers that are electrically coupled to the anode layer, the sixth plurality of fingers are interdigitated with the fifth plurality of fingers to increase the capacitance of the capacitor.

28. The capacitor of claim 20 wherein a capacitance provided by the interdigitated first and second pluralities of fingers is at least about 3% of a capacitance provided by the anode layer and cathode layer.

29. The capacitor of claim 20 wherein a capacitance provided by the interdigitated first and second pluralities of fingers is at least about 5% of a capacitance provided by the anode layer and cathode layer.

30. The capacitor of claim 20 wherein a capacitance provided by the interdigitated first and second pluralities of fingers is at least about 10% of a capacitance provided by the anode layer and cathode layer.

* * * * *